United States Patent [19]
Münch et al.

[11] Patent Number: 6,038,381
[45] Date of Patent: Mar. 14, 2000

[54] METHOD AND SYSTEM FOR DETERMINING A SIGNAL THAT CONTROLS THE APPLICATION OF OPERANDS TO A CIRCUIT-IMPLEMENTED FUNCTION FOR POWER SAVINGS

[75] Inventors: Michael Münch, Bonn; Bernd Wurth, Rosenheim, both of Germany; Renu Mehra, Santa Clara; James David Sproch, Saratoga, both of Calif.

[73] Assignee: Synopsys, Inc., Mountain View, Calif.

[21] Appl. No.: 08/977,562

[22] Filed: Nov. 25, 1997

[51] Int. Cl.$^7$ ........................................... G06F 17/50
[52] U.S. Cl. ............................... 395/500.02; 395/500.04; 395/500.39; 395/556
[58] Field of Search .................... 395/500.02, 500.04, 395/500.05, 500.39, 556, 557, 750.03, 183.09

[56] References Cited

U.S. PATENT DOCUMENTS

| | | | |
|---|---|---|---|
| 5,825,646 | 10/1998 | Keeler et al. | 364/164 |
| 5,847,981 | 12/1998 | Kelley et al. | 364/750.5 |
| 5,903,466 | 5/1999 | Beausang et al. | 364/488 |

OTHER PUBLICATIONS

Overview of the Power Minimization Techniques Employed in the IBM PowerPC 4XX Embedded Controllers, Anthony Correale, Jr., PowerPC Integrated Solutions IBM Microelectronics, RTP, NC, International Symposium on Low Power Design, Dana Point, CA, Aug. 1995.

"Guarded Evaluation: Pushing Power Management to Logic Synthesis/Design", Tiwari et al., International Symposium on Low Power Design, Dana Point, CA, Apr. 1995.

*Primary Examiner*—Kevin J. Teska
*Assistant Examiner*—Thai Phan
*Attorney, Agent, or Firm*—Wagner, Murabito & Hao LLP

[57] ABSTRACT

A computer-implemented process for determining a signal function for use in controlling the application of signal operands to a circuit-implemented function for the purpose of power reduction. The present invention receives a netlist represented as a graph data structure having nodes interconnected with signal lines. A node can have one output (single fan-out) or can have more than one output (multiple fan-outs). Termination points of the graph are identified as inputs to registers or primary outputs. From the termination points, and using a breadth-first traversal process, the present invention traverses each node of the netlist. A parent node is not processed in the breadth-first traversal until all of its child nodes have been processed. During traversal, an activation signal function is constructed for each input of a node. If the node has multiple outputs then a disjunctive Boolean expression is used, otherwise a conjunctive Boolean expression is used to determine the activation signal function. Activation signal circuitry is then added to each node if the power savings meet certain specified area and timing considerations. Selected nodes have operand isolation circuitry added thereto to implement the activation signal functions. The activation signal circuitry is used to gate the operand signal inputs to the node thereby saving power when the node's output is ignored.

23 Claims, 24 Drawing Sheets

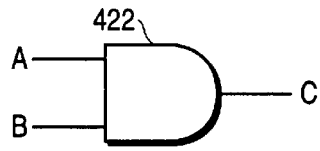
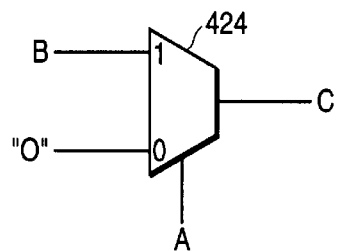
FIG.7B
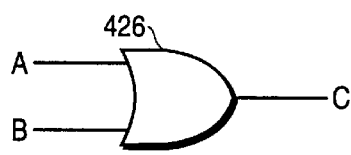
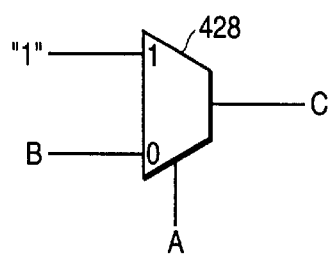
FIG.7C

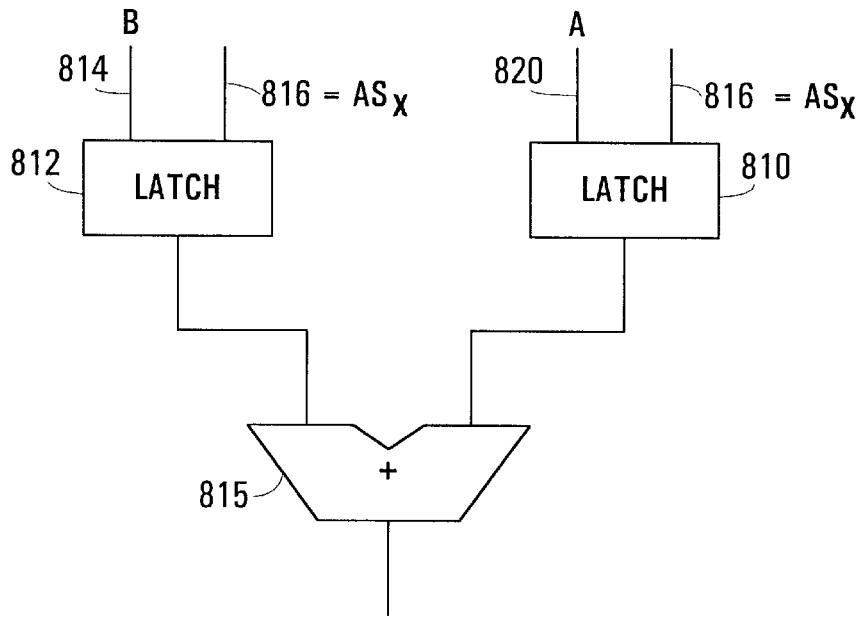

FIGURE 11A $$\Delta P^X p = p(\neg AS_X \wedge AS_{X_i} \wedge g_{X_i}^{A,X} \wedge AS_{X_j} \wedge g_{X_j}^{B,X}) \cdot f^X(TR_{X_i} * (1), TR_{X_j} * (1)) +$$

$$p(\neg AS_X \wedge AS_{X_i} \wedge g_{X_i}^{A,X} \wedge \neg AS_{X_j} \wedge g_{X_j}^{B,X}) \cdot f^X(TR_{X_i} * (1), TR_{X_j} * (0)) +$$

$$p(\neg AS_{X_i} \wedge AS_{X_i} \wedge g_{X_i}^{A,X} \neg AS_{X_j} \wedge g_{X_j}^{B,X}) \cdot f^X(TR_{X_i} * (0), TR_{X_j} * (1)) +$$

$$p(\neg AS_X \wedge \neg AS_{X_i} \wedge g_{X_i}^{A,X} \wedge \neg AS_{X_j} \wedge g_{X_j}^{B,X}) \cdot f^X(TR_{X_i} * (0), TR_{X_j} * (0))$$

FIGURE 11B

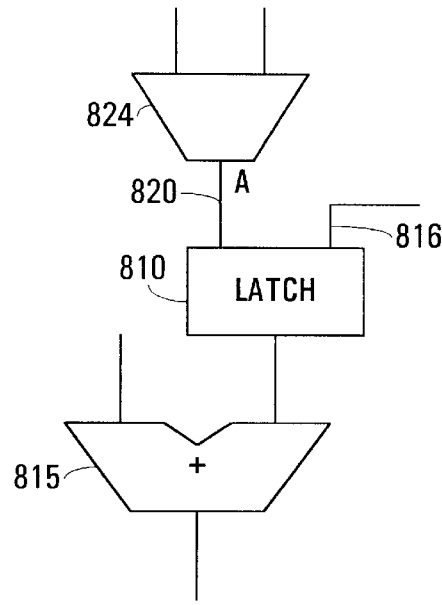

FIGURE 12A $$\Delta P^x_p = \sum_{(x_i, x_j) \in FI_A(x) \times FI_B(x)} p(\neg AS_x \wedge AS_{x_i} \wedge g^{A,x}_{x_i} \wedge AS_{x_j} \wedge g^{B,x}_{x_j}) \cdot$$

$$f^x(TR_{x_i} * (1), TR_{x_j} * (1)) +$$

$$p(\neg AS_x \wedge AS_{x_i} \wedge g^{A,x}_{x_i} \wedge \neg AS_{x_j} \wedge g^{B,x}_{x_j}) \cdot$$

$$f^x(TR_{x_i} * (1), TR_{x_j} * (0)) +$$

$$p(\neg AS_x \wedge \neg AS_{x_i} \wedge g^{A,x}_{x_i} \wedge AS_{x_j} \wedge g^{B,x}_{x_j}) \cdot$$

$$f^x(TR_{x_i} * (0), TR_{x_j} * (1)) +$$

$$p(\neg AS_x \wedge \neg AS_{x_i} \wedge g^{A,x}_{x_i} \wedge \neg AS_{x_j} \wedge g^{B,x}_{x_j}) \cdot$$

$$f^x(TR_{x_i} * (0), TR_{x_j} * (0))$$

FIGURE 12B $$\Delta P_S^X = p(\neg AS_X \wedge AS_{X_i}) \cdot [f^{X_i}(TR_{X'}, TR_{X_j}) - f^{X_i}(0, TR_{X_j})] +$$

$$(1 - \bar{x}_i) \cdot p(\neg AS_X \wedge \neg AS_{X_i}) \cdot [f^{X_i}(TR_{X'}, TR_{X_j}) - f^{X_i}(0, TR_{X_j})]$$

FIGURE 13A

$$\Delta P_S^X = p(\neg AS_X \wedge AS_{X_i} \wedge AS_{X_j}) \cdot [f^{X_i}(TR_{X'}, TR_{X_j}*(1)) - f^{X_i}(0, TR_{X_j}*(1))] +$$

$$= p(\neg AS_X \wedge AS_{X_i} \wedge \neg AS_{X_j}) \cdot [f^{X_i}(TR_{X'}, TR_{X_j}*(0)) - f^{X_i}(0, TR_{X_j}*(0))] +$$

$$(1 - \bar{x}_i) \cdot p(\neg AS_X \wedge \neg AS_{X_i} \wedge AS_{X_j}) \cdot [f^{X_i}(TR_{X'}, TR_{X_j}*(1)) - f^{X_i}(0, TR_{X_j}*(1))] +$$

$$(1 - \bar{x}_i) \cdot p(\neg AS_X \wedge \neg AS_{X_i} \wedge \neg AS_{X_j}) \cdot [f^{X_i}(TR_{X'}, TR_{X_j}*(1)) - f^{X_i}(0, TR_{X_j}*(0))]$$

FIGURE 13B

$$\Delta P_s^x = \sum_{x_j:\,(x_j \in FI_B(x_i) \land x \in FI_A(x_j))} [\, p(\neg AS_x \land AS_{x_i} \land g_x^{A,x_i} \land AS_{x_j}\, g_{x_j}^{B,x_i}) \cdot$$

$$[\, f^{x_i}(TR_x, TR_{x_j}*(1)) - f^{x_i}(0, TR_{x_j}*(1))\,] +$$

$$p(\neg AS_x \land AS_{x_i} \land g_x^{A,x_i} \land \neg AS_{x_j} \land g_{x_j}^{B,x_i}) \cdot$$

$$[\, f^{x_i}(TR_x, TR_{x_j}*(0)) - f^{x_i}(0, TR_{x_j}*(0))\,] +$$

$$(1 - \overline{x}_i) \cdot p(\neg AS_x \land \neg AS_{x_i} \land g_x^{A,x_i} \land AS_{x_j} \land g_{x_j}^{B,x_i}) \cdot$$

$$[\, f^{x_i}(TR_x, TR_{x_j}*(1)) - f^{x_i}(0, TR_{x_j}*(1))\,] +$$

$$(1 - \overline{x}_i) \cdot p(\neg AS_x \land \neg AS_{x_i} \land g_x^{A,x_i} \land \neg AS_{x_j} \land g_{x_j}^{B,x_i}) \cdot$$

$$[\, f^{x_i}(TR_x, TR_{x_j}*(1)) - f^{x_i}(0, TR_{x_j}*(1))\,] +$$

$$\sum_{x_j:\, x_j \in FI_A(x_i) \land x \in FI_B(x_i)} [\, p(\neg AS_x \land AS_{x_i} \land g_x^{B,x_i} \land AS_{x_j} \land g_{x_j}^{A,x_i}) \cdot$$

$$[\, f^{x_i}(TR_{x_i}*(1), TR_x) - f^{x_i}(TR_{x_j}*(1), 0)\,] +$$

$$p(\neg AS_x \land AS_{x_i} \land g_x^{B,x_i} \land \neg AS_{x_j} \land g_{x_j}^{A,x_i}) \cdot$$

$$[\, f^{x_i}(TR_{x_i}*(0), TR_x) - f^{x_i}(TR_{x_j}*(0), 0)\,] +$$

$$(1 - \overline{x}_i) \cdot p(\neg AS_x \land \neg AS_{x_i} \land g_x^{B,x_i} \land AS_{x_j} \land g_{x_j}^{A,x_i}) \cdot$$

$$[\, f^{x_i}(TR_{x_i}*(1), TR_x) - f^{x_i}(TR_{x_j}*(1), 0)\,] +$$

$$(1 - \overline{x}_i) \cdot p(\neg AS_x \land \neg AS_{x_i} \land g_x^{B,x_i} \land \neg AS_{x_j} \land g_{x_j}^{A,x_i}) \cdot$$

$$\Delta P_s^x = \sum_{x_i \in FO(x)} \sum_{x_j: (x_j \in FI_B(x_i) \wedge x \in FI_A(x_i))} [\, p(\neg AS_x \wedge AS_{x_i} \wedge g_x^{A,x_i} \wedge AS_{x_j}\, g_{x_j}^{B,x_i}) \cdot$$

$$[\, f^{x_i}(TR_x, TR_{x_j}*(1)) - f^{x_i}(0, TR_{x_j}*(1))\,] +$$

$$p(\neg AS_x \wedge AS_{x_i} \wedge g_x^{A,x_i} \wedge \neg AS_{x_j} \wedge g_{x_j}^{B,x_i}) \cdot$$

$$[\, f^{x_i}(TR_x, TR_{x_j}*(0)) - f^{x_i}(0, TR_{x_j}*(0))\,] +$$

$$(1 - \overline{x}_i) \cdot p(\neg AS_x \wedge \neg AS_{x_i} \wedge g_x^{A,x_i} \wedge AS_{x_j} \wedge g_{x_j}^{B,x_i}) \cdot$$

$$[\, f^{x_i}(TR_x, TR_{x_j}*(1)) - f^{x_i}(0, TR_{x_j}*(1))\,] +$$

$$(1 - \overline{x}_i) \cdot p(\neg AS_x \wedge \neg AS_{x_i} \wedge g_x^{A,x_i} \wedge \neg AS_{x_j} \wedge g_{x_j}^{B,x_i}) \cdot$$

$$[\, f^{x_i}(TR_x, TR_{x_j}*(1)) - f^{x_i}(0, TR_{x_j}*(1))\,] +$$

$$\sum_{x_j: x_j \in FI_A(x_i) \wedge x \in FI_B(x_i)} [\, p(\neg AS_x \wedge AS_{x_i} \wedge g_x^{B,x_i} \wedge AS_{x_j} \wedge g_{x_j}^{A,x_i}) \cdot$$

$$[\, f^{x_i}(TR_{x_j}*(1), TR_x) - f^{x_i}(TR_{x_j}*(1), 0)\,] +$$

$$p(\neg AS_x \wedge AS_{x_i} \wedge g_x^{B,x_i} \wedge \neg AS_{x_j} \wedge g_{x_j}^{A,x_i}) \cdot$$

$$[\, f^{x_i}(TR_{x_j}*(0), TR_x) - f^{x_i}(TR_{x_j}*(0), 0)\,] +$$

$$(1 - \overline{x}_i) \cdot p(\neg AS_x \wedge \neg AS_{x_i} \wedge g_x^{B,x_i} \wedge AS_{x_j} \wedge g_{x_j}^{A,x_i}) \cdot$$

$$[\, f^{x_i}(TR_{x_j}*(1), TR_x) - f^{x_i}(TR_{x_j}*(1), 0)\,] +$$

$$(1 - \overline{x}_i) \cdot p(\neg AS_x \wedge \neg AS_{x_i} \wedge g_x^{B,x_i} \wedge \neg AS_{x_j} \wedge g_{x_j}^{A,x_i}) \cdot$$

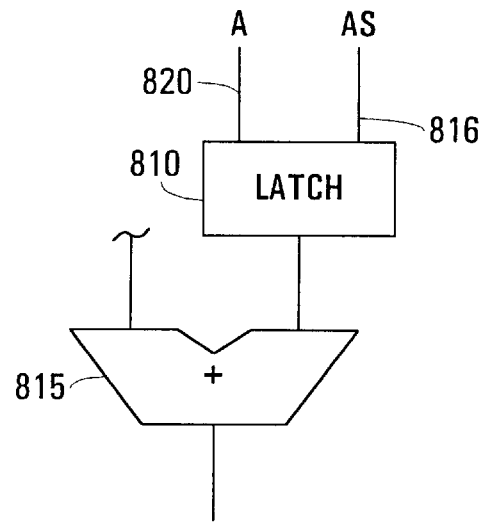

FIGURE 16A

$$\Delta P_{p,A}^{x} = \sum_{x_j : (x_j \in FI_A(x_i) \land x \in FI_B(x_j))} [ p(\neg AS_x \land AS_{x_i} \land g_x^{A,x_i} \land AS_{x_j} g_{x_i}^{B,x_j}) \cdot$$

$$[ f^x ( TR_{x_i}^*(1), TR_{x_j}^*(1)) - f^x (0, TR_{x_j}^*(1)) ] +$$

$$p(\neg AS_x \land AS_{x_i} \land g_{x_i}^{A,x_i} \land \neg AS_{x_j} \land g_{x_j}^{B,x}) \cdot$$

$$( f^x ( TR_{x_i}^*(1), TR_{x_j}^*(0)) - f^x (0, TR_{x_j}^*(0)) ) +$$

$$p(\neg AS_x \land \neg AS_{x_i} \land g_{x_i}^{A,x} \land AS_{x_j} \land g_{x_j}^{B,x}) \cdot$$

$$( f^x ( TR_{x_i}^*(0), TR_{x_j}^*(1)) - f^x (0, TR_{x_j}^*(1))) +$$

$$p(\neg AS_x \land \neg AS_{x_i} \land g_{x_i}^{A,x} \land \neg AS_{x_j} \land g_{x_j}^{B,x}) \cdot$$

METHOD AND SYSTEM FOR DETERMINING A SIGNAL THAT CONTROLS THE APPLICATION OF OPERANDS TO A CIRCUIT-IMPLEMENTED FUNCTION FOR POWER SAVINGS

BACKGROUND OF THE INVENTION

1. Field of the Invention

The present invention relates to the field of electronic design automation (EDA). More specifically, the present invention relates to the field of techniques for reducing power consumption within integrated circuits designed using a computer controlled EDA system.

2. Related Art

Electronic design automation (EDA) systems are a form of computer aided design (CAD) systems and are used for designing integrated circuit (IC) devices. The EDA system typically receives one or more high level behavioral descriptions of an IC device (e.g., in HDL or VHDL or Verilog languages) and translates this high level design language description into netlists of various levels of abstraction. At a higher level of abstraction, a generic netlist is typically produced that can be translated into a lower level technology-specific netlist based on a technology-specific library. A netlist describes the IC design and is composed of nodes (elements) and edges, e.g., connections between nodes, and can be represented using a directed cyclic graph structure having nodes which are connected to each other with signal lines. A single node can have multiple fan-ins and multiple fan-outs. The netlist is typically stored in computer readable media within the EDA system and processed and verified using many well known techniques. One result is a physical device layout in mask form which can be used to directly implement structures in silicon to realize the physical IC device.

Often, during the many optimizations and refinements of the netlist design, the power consumed by the netlist design becomes an important consideration for an IC designer. The IC designers desire to reduce the power consumed by various netlist designs in order to satisfy often specified low power consumption constraints for their circuits. Low power consumption constraints can be relevant for a number of different applications. For example, the resulting IC device might be used in a portable device having limited battery life, or, the IC device might be integrated within a system in which heat dissipation is a critical factor, etc. The supply of IC devices for portable (e.g., battery powered) components is a large and growing market segment including hand-held communication and computing devices as well as portable computer systems. For a number of commercially important reasons, not the least of which is routine energy conservation, designers want to reduce the power consumed and dissipated by their IC devices.

One technique for power consumption reduction is called operand isolation, an example of which is shown in circuit 10 of FIG. 1A. One implementation of this technique is described by A. Correale, Jr., in a paper entitled, "Overview of the Power Minimization Techniques Employed in the IBM PowerPC 4xx Embedded Controllers," published in 1995 by the International Symposium on Low Power Design (ISLPD) at Dana Point, Calif. The concept within operand isolation is to isolate the input operand signals of a functional unit during those clock cycles when the output of the functional unit is not propagated through the netlist (e.g., it is not used by the netlist and does not alter the primary outputs of the IC device).

Circuit 10 of FIG. 1A includes four functional units 12, 14, 16 and 18 implemented in circuitry. The input operand signals originate from an operand bus 30. These circuits 12, 14, 16 and 18 consume power when their inputs transition, whether or not their outputs are used. Without operand isolation, the circuits 12, 14, 16 and 18 concurrently execute each clock cycle and a single output is selected among them by multiplexer 20 and propagated. Power is needlessly wasted because only one functional unit's output is propagated by multiplexer 20 per clock cycle.

However, with operand isolation as shown in FIG. 1A, each operand signal must pass through an operand latch circuit 40a, 40b, 40c and 40d which only allows passage when its corresponding functional unit's output is selected by the multiplexer 20. Operand signals only pass through circuit 40a when signal t1 is active (c1 is #t1); operand signals only pass through circuit 40b when signal t2 is active (c2 is #t2); operand signals only pass through circuit 40c when signal t3 is active (c3 is #t3); and operand signals only pass through circuit 40d when signal t4 is active (c4 is #t4). Signals t1 through t4 originate from the select inputs of multiplexer 20 which selects only one of the outputs from circuits 12, 14, 16 and 18 for any given clock cycle. Signals t1 through t4 are used by circuits 40a–40d to isolate the operands of three of the functional unit circuits for each clock cycle and allow only one functional unit circuit to operate. By isolating the operand inputs as described above, the functional unit circuits that produce unneeded results are disabled and do not needlessly consume power.

The problem with circuit 10 is that the signals t1–t4, which control the operand isolation circuits 40a–40d, originate from existing circuitry of the underlying circuit. In most cases, designers cannot rely on isolation signals originating from existing circuitry of the underlying circuit. For instance, these signals t1–t4 exist whether or not operand isolation is applied to the functional units 12, 14, 16, 18. In many cases, there may not be a suitable signal (to use for operand isolation) existing within the underlying circuit, or, the signals existing within the underlying circuit may not give the isolation coverage desired by an IC designer. In effect, the signals available to control isolation circuits may isolate the operands of a functional unit circuit only during a small subset of the instances where the function's output is ignored. In this case, only a fraction of the total possible power savings is achieved.

Another prior art method of operand isolation is described in a paper entitled, "Guarded Evaluation: Pushing Power Management to Logical Synthesis/Design," published in 1995 by the ISLPD at Dana Point, Calif. by V. Tiwari. Tiwari describes a circuit having transparent latches that make up guard logic to perform operand isolation. The latches control the passage of input operand signals to arithmetic functional units (e.g., shifters, adders, etc.) In a pass mode, the latch allows the operand signals to pass through and in a non-pass mode the latch holds its previous value to prevent new operand signals from reaching the arithmetic functional unit. The guard logic is controlled by a signal, s, which is based on the observability of the output of the arithmetic functional unit. Like Correale, Tiwari uses an existing signal from the underlying circuit to achieve the signal, s. Specifically, Tiwari uses ATPG (Automatic Test Pattern Generation) tools to find the existing signal to couple as signal s.

Because Tiwari is limited by controlling the guard logic with an underlying signal that already exists within the netlist, Tiwari is limited in two ways. First, the operand isolation coverage available for each node is limited and, second, Tiwari is limited in the number of nodes to which his operand isolation can be applied at all. For instance, FIG. 1B illustrates a set 64 of all conditions under which an arithmetic functional unit generates an output that is not needed (e.g., an observability don't care condition). By using only a signal that exists within the netlist to generate signal s, Tiwari is limited to only a subset 62 of set 64 where subset 62 represents power savings achieved and set 64 represents total possible power savings. In this manner, operand isolation coverage of set 62 is limited. Further, using the concepts of ATPG and observability may not even result in an existing signal that can be used for isolation coverage with respect to particular nodes. In this case, under Tiwari, operand isolation would not even be applied to these particular nodes because there exists no signal to control the isolation logic. Therefore, no power savings is achieved for these nodes.

Accordingly, what is needed is a mechanism and method for applying operand isolation to reduce power consumption of integrated circuit designs that offers extended operand isolation coverage for nodes that have operand isolation applied to them. What is also needed is a mechanism and method for applying operand isolation to a larger number of nodes within a netlist than is allowed under the prior art. In view of the above advantages, a system and method could be provided that increases the amount of power savings an IC designer could implement within an IC design using an EDA system. The present invention provides these advantageous functionalities. These and other advantages of the present invention not specifically mentioned above will become clear within discussions of the present invention presented herein.

SUMMARY OF THE INVENTION

A computer-implemented process is described herein for deterministically computing a signal function for use in controlling the application of signal operands to a circuit-implemented function for the purpose of power conservation. The present invention receives a netlist and identifies its combinational blocks and the nodes within each block. The block is represented as a graph data structure having nodes which are interconnected with signal lines. A node can have one output (single fan-out) or can have more than one output (multiple fan-outs). Termination points of the graph are identified as inputs to registers or primary outputs. From the termination points, and using a breadth-first traversal process, the present invention traverses each node of the netlist. A parent node is not processed in the breadth-first traversal until all of its child nodes have been processed.

During node traversal, an activation signal function is computed for individual inputs of a node. Generally, the expressions of the activation signal function for a given node involve the activation signal functions of its child nodes, any control signals of the node and a Boolean expression. If the node has multiple outputs, then a disjunctive Boolean expression is used to determine the activation signal function. If the node has one or fewer outputs, a conjunctive Boolean expression is used to determine the activation signal function. Activation signal circuitry is then selectively added to each node if the power savings meet certain specified area and timing considerations. The activation signal circuitry is used to gate the operand signal inputs to the node thereby avoiding power consumption within the node when the node's output is not needed by its transitive fan-out. Circuit simulation, taking into account input toggle rates and frequency of use of a particular node's output, is used to estimate if the power consumed by the activation signal circuitry is equal to or less than the power saved by using the activation signal circuitry within the particular node.

Specifically, an embodiment of the present invention includes a computer implemented method for incorporating operand isolation in an integrated circuit design, the method comprising the steps of: a) receiving a netlist describing the integrated circuit design, the netlist having nodes and connections between the nodes; b) traversing nodes of the netlist to determine an activation signal function for a node of the netlist, the activation signal function indicating all states in which an output signal generated by the node is used by the integrated circuit design and all states in which the output signal is not used; c) synthesizing an activation signal generation circuit based on the activation signal function of the node; and d) within the netlist, adding a blocking circuit in the path of an input to the node and adding the activation signal generation circuit to the node to control the blocking circuit.

BRIEF DESCRIPTION OF THE DRAWINGS

FIG. 7B is illustrates an AND gate as a blocking circuit and its logical equivalent circuit using a multiplexer.

FIG. 7C is illustrates an OR gate as a blocking circuit and its logical equivalent circuit using a multiplexer.

FIG. 11A represents a node having two operands that are isolated in accordance with the present invention and FIG. 11B illustrates an expression representing the primary power savings for the configuration of FIG. 11A.

FIG. 12A represents a node with operand isolation and having multiple fan-ins based on a multiplexer network and FIG. 12B illustrates an expression representing the primary power savings for the configuration of FIG. 12A.

FIG. 13A and FIG. 13B illustrate expressions used in computing secondary power savings for nodes with operand isolation in accordance with the present invention having a single fan-out.

FIG. 14 illustrates expressions used in the present invention for determining secondary power savings, e.g., for nodes having multiplexers at inputs.

FIG. 15 illustrates expressions used in the present invention for determining total power savings by summing over all nodes in the fan-out of node x.

FIG. 16A represents a node having asymmetric operand isolation in accordance with the present invention and FIG. 16B illustrates an expression representing the primary power savings for the configuration of FIG. 16A.

DETAILED DESCRIPTION OF THE INVENTION

Figure 1A:
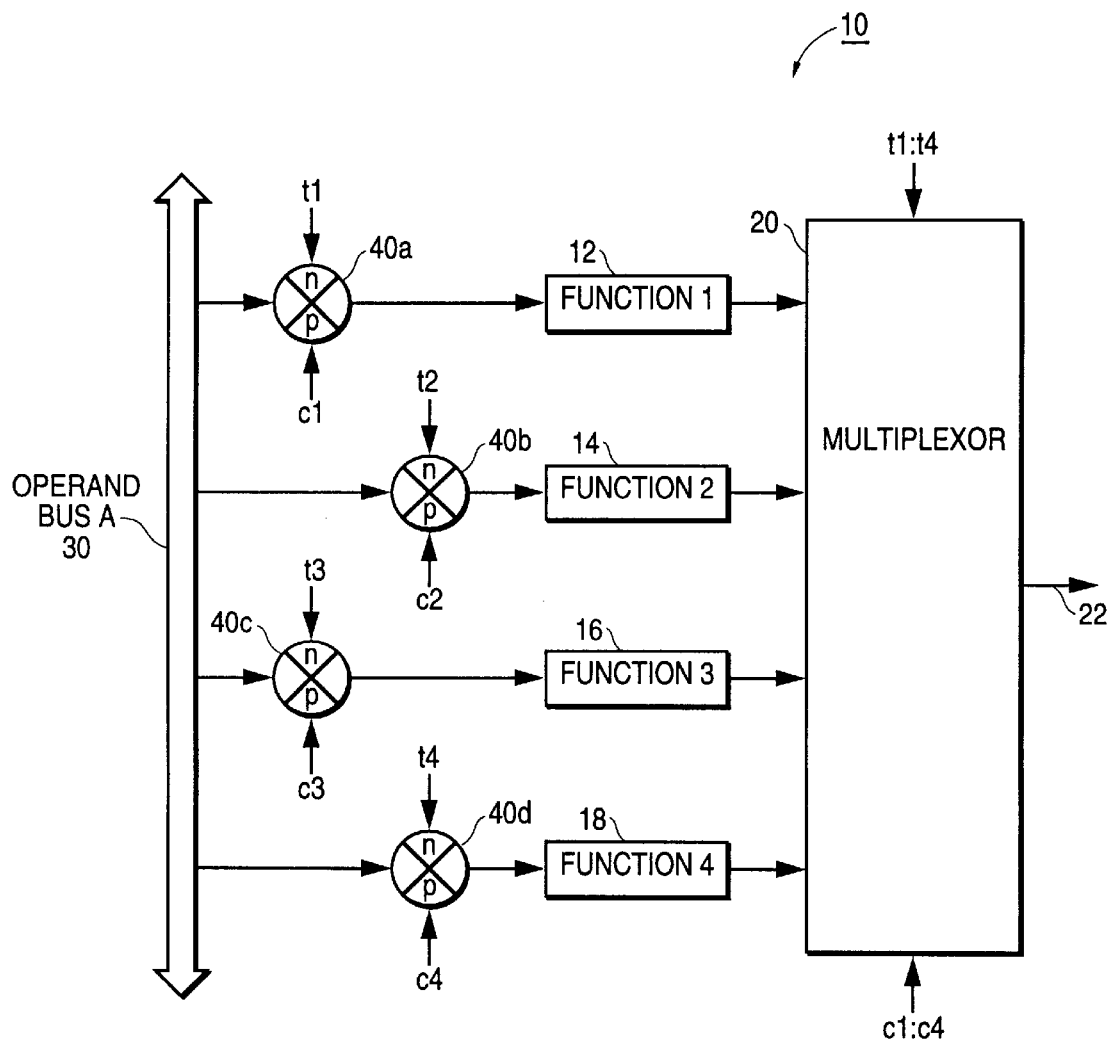
FIG. 1A illustrates a prior art circuit for performing operand isolation within an integrated circuit design.
Figure 1B:
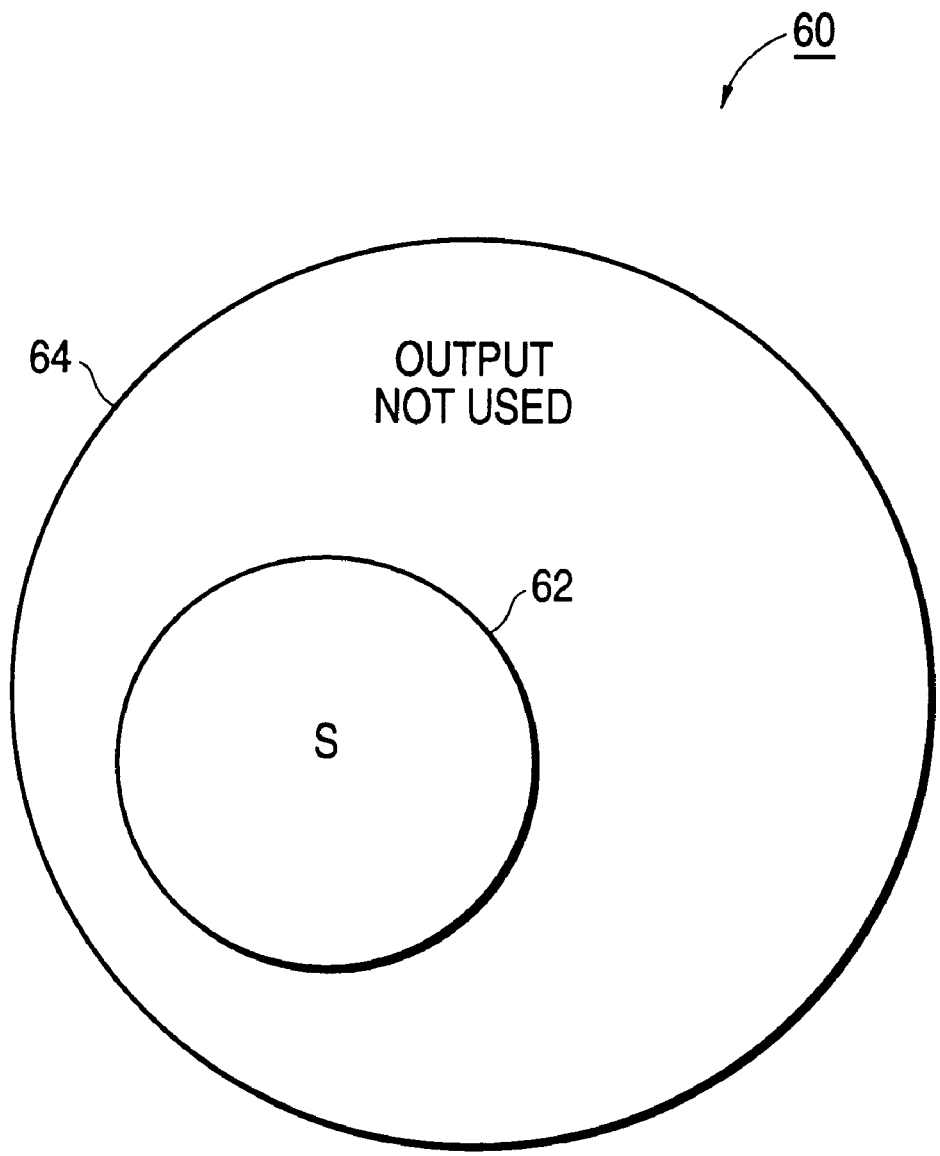
FIG. 1B illustrates a prior art signal, s, available from the underlying design and used to indicate a subset of the set of states when the output of a particular circuit function is not used, e.g., don't care states.

In the following detailed description of the present invention, a process and system for determining an activation signal function and for selectively implementing determined operand isolation circuitry into a node for power savings, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system (e.g., FIG. 2), or similar electronic computing device, that manipulates and transforms data represented as physical (electronic) quantities within the computer system's registers and memories into other data similarly represented as physical quantities within the computer system memories or registers or other such information storage, transmission or display devices.

Computer System Platform 112

Aspects of the present invention, described below, are discussed in terms of steps executed on a computer system (e.g., processes 500, 550, 700 and 910). Although a variety of different computer systems can be used with the present invention, an exemplary general purpose computer system 112 is shown in FIG. 2.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage medias (e.g., diskettes, tapes) which are computer readable memories.

Figure 2:
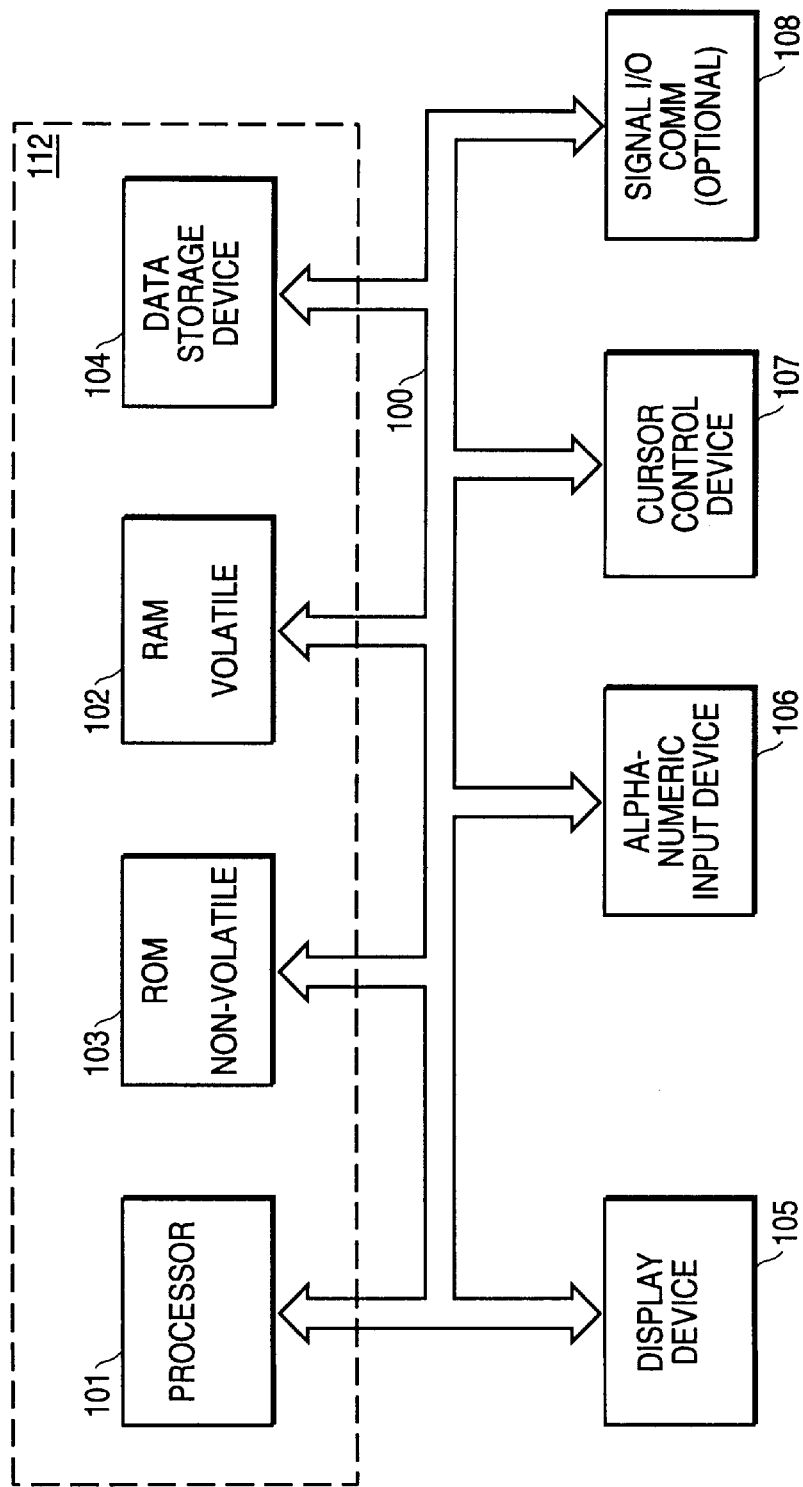
FIG. 2 is a general purpose computer system on which embodiments of the present invention can be implemented.

Also included in computer system 112 of FIG. 2 is an alphanumeric input device 106 including alphanumeric and function keys coupled to the bus 100 for communicating information and command selections to the central processor 101. System 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

Method and System for Constructing Activation Signal Functions for Nodes

The present invention includes a method and system for constructing a signal function used to control blocking circuits which gate the passage of new signal operands to functional unit circuits. The blocking circuits, e.g., latches, logic gates, pass gates, etc., perform operand isolation, based on the signal function, to achieve power savings within an IC design represented by a netlist. In one embodiment, the blocking circuits are transparent latches controlled by a control signal (e.g., an activation signal or an isolation signal).

Activation Signal vs. Isolation Signal. Within the following discussions the terms "isolation signal" and "activation signal" while not synonymous are very much related. An "isolation signal" is used to control the blocking circuits (e.g., latches) and is active during periods when operand signals are not to pass through the blocking circuits and is not active otherwise. However, an "activation signal" is used to control the blocking circuits and is active during periods when the operand signals are allowed to pass through the blocking circuits and is not active otherwise. From this discussion, it is clear that the isolation signal is functionally the negation of the activation signal. In view of the foregoing, within discussions of the present invention that include the term "activation signal" is it appreciated that the term "isolation signal" can always be replaced therewith with the appropriate logical negation or the appropriate selection of blocking circuits to achieve the desired result.

For uniformity, discussions of an embodiment of the present invention assume that the blocking circuits used do not pass operand signals when their associated control signal is low and do pass operand signals when their associated control signal is high; the control signal is therefore the activation signal. It is appreciated that, in an alternative embodiment, a different blocking circuit can be substituted that does pass operand signals when its control signal is low and does not pass operands when its control signal is high; in this case the control signal is the isolation signal. The two alternative designs are entirely equivalent within the scope of the present invention and the choice of one design over the other merely an implementation detail. Furthermore, although a circuit may generate an activation signal, it can generally be referred to with the term "operand isolation circuitry."

Figure 3A:
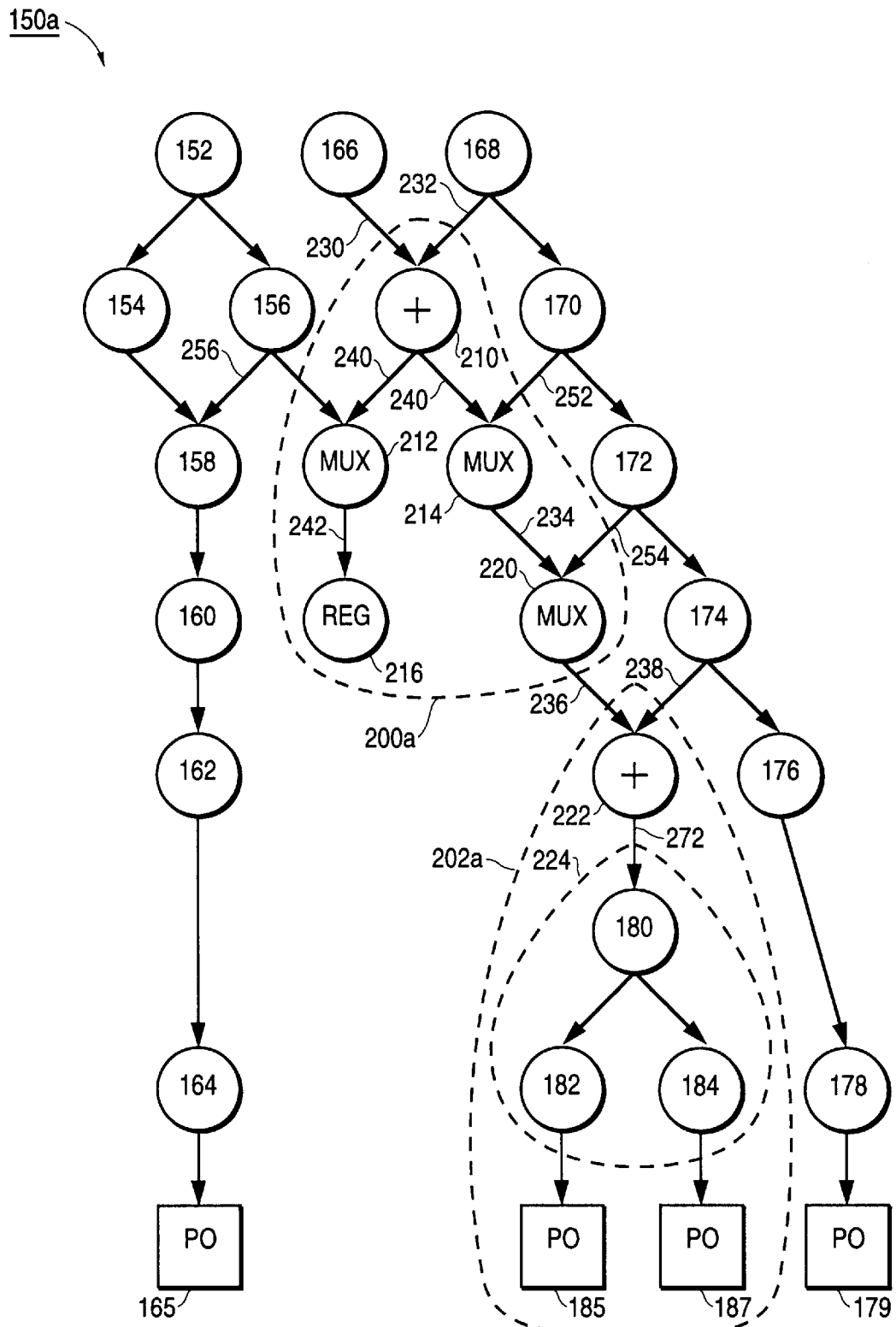
FIG. 3A illustrates a netlist representing a physical integrated circuit device having node elements and signal connections between node elements.
Figure 3B:
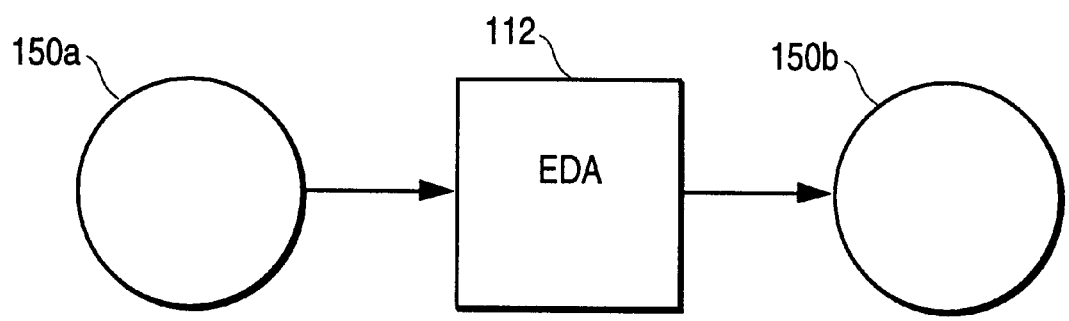
FIG. 3B illustrates an input netlist processed by an embodiment of the present invention which generates a modified netlist representing a physical IC device with operand isolation circuitry.

Input Netlist and Modified Netlist. With reference to FIG. 3A, a portion of an input netlist 150a is shown that represents a physical IC device. As shown in FIG. 3B, this netlist 150a is input to the processes of the present invention (within system 112) which are used to determine and add power savings circuitry to netlist 150a to realize a modified netlist 150b. In one embodiment, operand isolation is performed on register-transfer (RT) level nodes after mapping of synthetic operators. In one embodiment, the transformation is considered for nodes having arithmetic elements which are likely to have significant power consumption, e.g., arithmetic logic units (ALUs), adder circuits, multiplier circuits, and the like. The operand isolation circuitry added by the present invention to realize netlist 150b and the methods used to determine the content of this circuitry are described in greater detail below.

The nodes (e.g., 152, 154, 172, 222) of FIG. 3A represent circuit elements that are interconnected with signal lines (e.g., 234, 252, 272). A node can have one or more inputs (fan-ins) and can also have one or more outputs (fan-outs). The netlist 150a, as shown in FIG. 3A, can be represented as a graph data structure and is maintained in computer readable memories within system 112 (FIG. 2) using well known techniques. In this structure, a node can have one or more parent nodes (e.g., node 212 is a child of parent node 156 which itself is a child node of parent node 152) and a node can also have one or more child nodes (e.g., node 220 is a child of node 214 and both nodes 214 and 172 are child nodes of parent node 170). A child node receives an input signal from a parent node and a parent node supplies a signal to a child node.

The part of a netlist 150a that exists between sequential elements is called a block. Nodes can be referred to herein as "isolation candidates." Within the present invention, a node can contain any functional unit circuit. In one embodiment, operand isolation is applied only to nodes having arithmetic units, e.g., adder circuits, therein. Therefore, within this embodiment, a particular subgraph circuit 200a of FIG. 3A is outlined and constitutes an exemplary circuit to which isolation logic is applied. Circuit 200a includes an adder circuit 210. A second subgraph circuit is also shown as circuit 202a and contains an adder circuit 222.

As described herein, the present invention deterministically computes an activation signal function that is used for gating the inputs to each adder circuit of a node. The activation signal function is determined to be a signal that passes the operand signals to the adder only for those clock cycles in which the output of the adder is used by the IC device. In accordance with the present invention, operand isolation circuitry is added to the netlist 150a to produce the activation signal and also to gate the input operand signals (e.g., signals 230 and 232 with respect to circuit 200a). In one embodiment, the operand isolation circuitry includes activation signal generation circuits and blocking circuits coupled thereto.

Figure 4:
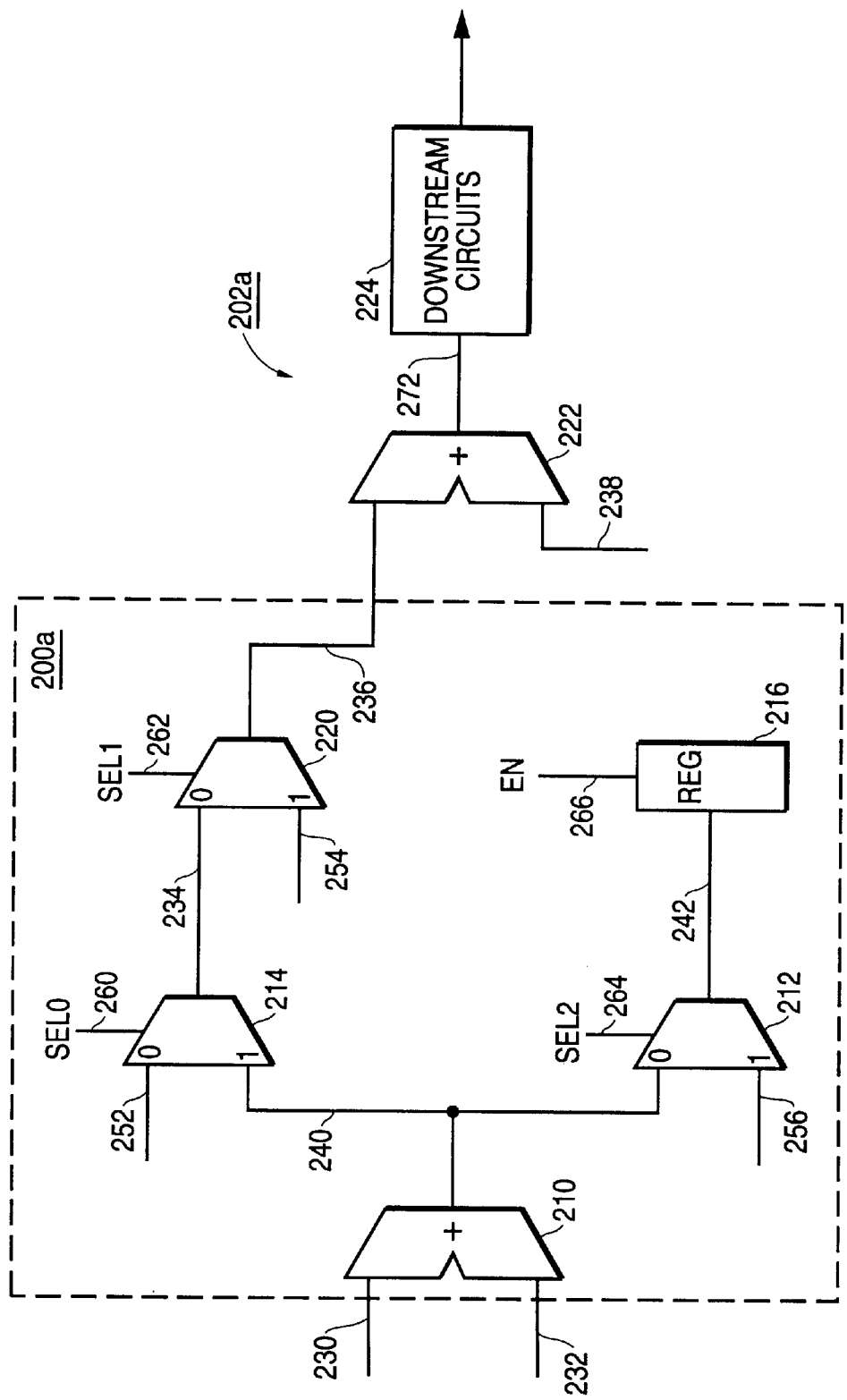
FIG. 4 illustrates one subgraph circuit and a portion of another subgraph circuit within the graph of FIG. 3A without operand isolation circuitry.

Exemplary Circuit w/o Operand Isolation Circuits. FIG. 4 illustrates a circuit schematic of the first circuit 200a in more detail and also illustrates a portion of the second circuit 202a. FIG. 4 illustrates contents within the input netlist 150a and therefore does not contain the operand isolation circuits of the present invention. Two input adder circuit 210 receives an input operand over signal line 230 and an input operand over signal line 232. Adder circuit 210 generates an output value over signal line 240 which is coupled as inputs to both multiplexer (mux) 214 and mux 212. Mux 212 also receives an input over line 256 (see also FIG. 3A). Mux 212 is controlled by a select signal (Sel2) over line 264. The output line 242 of mux 212 is coupled as an input to register 216 which accepts data when enable signal (EN), of line 266, is active.

Mux 214 of FIG. 4 also receives an input from line 252 (see also FIG. 3A) and a select input (Sel0) from line 260. The output of mux 214 is carried over line 234 to an input of mux 220 which also receives an input from line 254 (see also FIG. 3A). Mux 220 receives a select input (Sel1) from line 262. The output of mux 220 is carried over line 236 to the input of adder circuit 222 of the second circuit 202a. Adder 222 also receives an input over line 238 (see also FIG. 3A). Adder 222 outputs to downstream circuits 224 (see also FIG. 3A) over output line 272. Without the application of the operand isolation circuits of the present invention, there may be many states in which adder circuit 210 generates results which are ignored by circuit 202a and resistor 216 thereby consuming wasted power.

Figure 5:
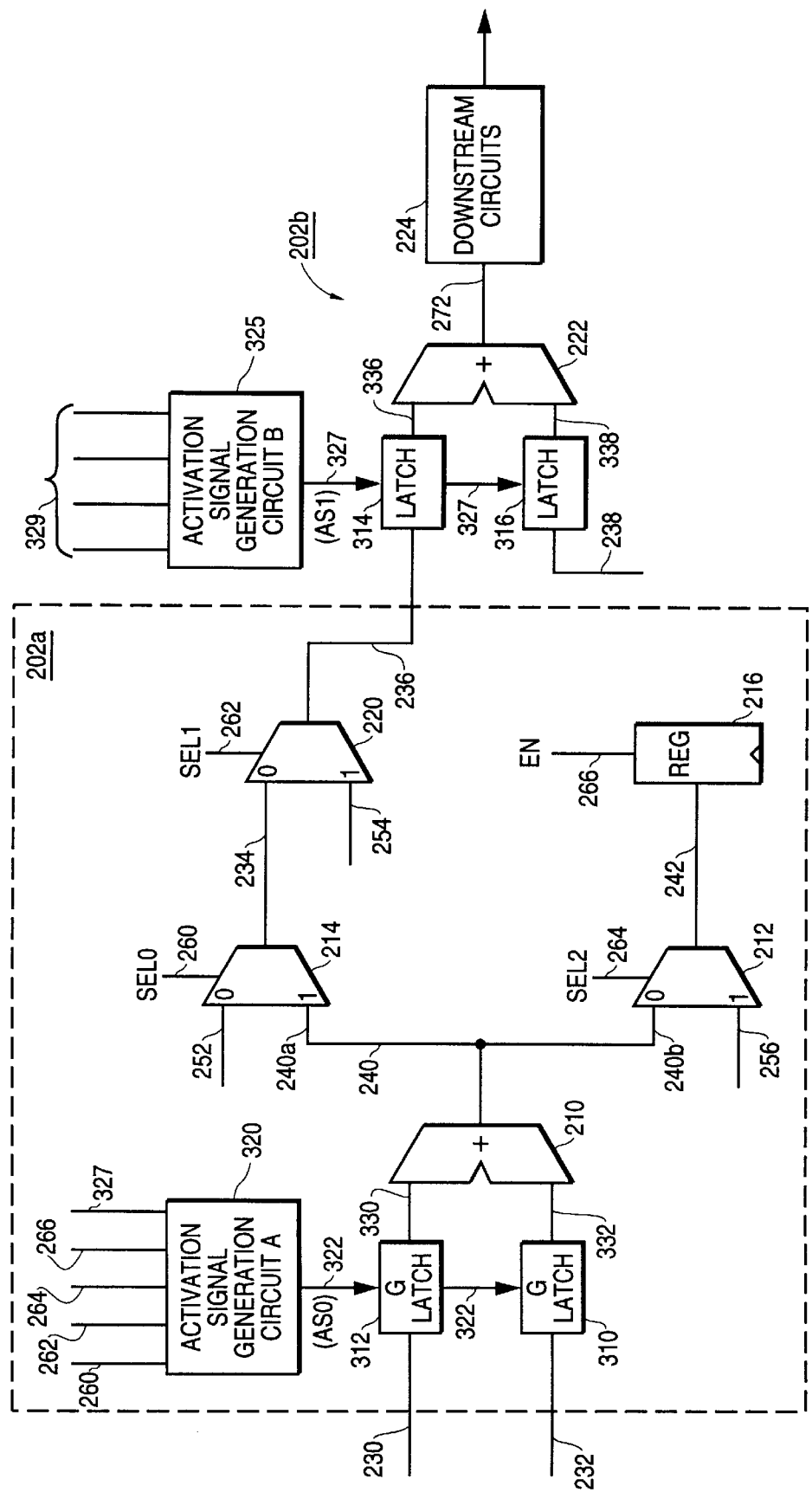
FIG. 5 illustrates the subgraph circuits of FIG. 4 with the addition of activation signal generation circuitry determined and added in accordance with the present invention to perform operand isolation.

Exemplary Circuit with Operand Isolation Circuits. FIG. 5 illustrates the resulting circuit 200b and circuit 202b after the insertion of operand isolation circuitry of the present invention. Circuit 200b and circuit 202b reside within modified netlist 150b (FIG. 3B) and are generated as output by one embodiment of the present invention. Circuit 200b is analogous to circuit 200a except for the operand isolation circuitry defined as the addition of blocking circuits 310 and 312 (e.g., latches) and the addition of activation signal generation circuit A 320 and signal routing connections to and from these devices. Circuit 202b is analogous to circuit 202a except for the operand isolation circuitry defined as the addition of blocking circuits 314 and 316 (e.g., latches) and the addition of activation signal generation circuit B 325 and signal routing connections to and from these devices.

Blocking circuits 312 and 310 of an embodiment of the present invention are transparent latches (but could also be edge triggered) and in pass mode they allow signal operands from lines 230 and 232 to pass, respectively, to the inputs 330 and 332 of adder 210. Operand signal lines 230 and 232 are coupled to the inputs of latches 312' and 310, respectively. In non-pass mode, latches 312 and 310 maintain (over lines 330 and 332) the values of the last set of input operand signals and ignore any transitions over input lines 230 and 232. Pass mode and non-pass mode are controlled by an activation signal (AS0) over line 322 which is fed to the gate input of each latch 312 and 310. In one embodiment, when the AS0 signal is active (e.g., 1), the latches 312 and 310 are in pass mode and when AS0 is not active (e.g., 0), the latches 312 and 310 are in non-pass mode. Alternatively, the negation of the activation signal (e.g., the isolation signal) can be used to control latches 312 and 310 and, in this mode, the latches 312 and 310 would not pass the input signals when the isolation signal was active and would pass them when the isolation signal was not active.

Activation Signal Generation Circuit. The AS0 signal over line 322 of FIG. 5 is generated by the activation signal generation circuit A 320 of the present invention. The activation signal function used to derive the activation signal generation circuit A 320 is determined by process 500 of the present invention described with reference to FIG. 8A. Whether or not this function is implemented into circuitry and actually added to circuit 200a for implementing operand isolation for this node is determined, in one embodiment, by the process 700 of FIG. 10.

Within the present invention, to identify nodes which frequently perform redundant computations, an activation signal function is generated for each isolation candidate (e.g., node). In one embodiment, the activation signal (ASx) for a node, x, evaluates to logic "1" if the node, x, produces data which is consumed by some node or register in its transitive fan-out. For instance, in FIG. 5, adder 210 feeds adder 222 and also feeds a register 216 through multiplexer networks. In accordance with the present invention, adder 210 is considered active if (1) adder 222 is active AND mux 214 and 220 are configured to connect output 240 to input 236 OR (2) if register 216 is enabled and receives input from adder 210. The resulting Boolean relationship for the activation signal (AS0) for adder 210 is called the "activation signal function" for adder 210 and is represented by:

AS0=[(Sel0) AND (#Sel1) AND (AS1)] OR [(#Sel2) AND (EN)]

where # is the negation operation and AS1 is the activation signal 327 for circuit 202b.

In other words, the output of adder 210 is only captured by register 216 when the EN signal is active and when the Sel2 line selects input "0" of mux 212, or, when the output of adder 222 is used and mux 214 selects the "1" input and when mux 220 selects the "0" input. In all other cases, the output of adder 210 is ignored by its transitive fan-out.

The activation signal function for adder 210 is implemented in circuitry by an activation signal generation circuit. The activation signal function for adder 210 is implemented in circuitry by activation signal generation circuit A 320 of FIG. 5 which is illustrated in more detail in FIG. 6. The activation signal generation circuit A 320 receives as input, signal Sel0 over line 260, signal Sel1 over line 262, signal Sel2 over line 264, signal EN over line 266 and signal AS1 over line 327. Line 260, the inverse of line 262, and line 327 are fed to AND gate 354 which outputs to OR gate 358. Line 266 and the inverse of line 264 are fed to AND gate 356 which outputs to OR gate 358. OR gate 358 generates the AS0 signal over line 322.

It is appreciated that the activation signal function of a node depends on the activation signal functions of nodes in its transitive fan-out. For instance, the activation signal function (AS0) for adder 210 directly depends on the activation signal function (AS1) of adder 222. Therefore, in accordance with the present invention, active signal functions are constructed in a bottom-up fashion starting at termination nodes. The process 500 used by the present invention for automatically constructing the activation signal functions is described with reference to FIG. 8A.

Figure 7A:
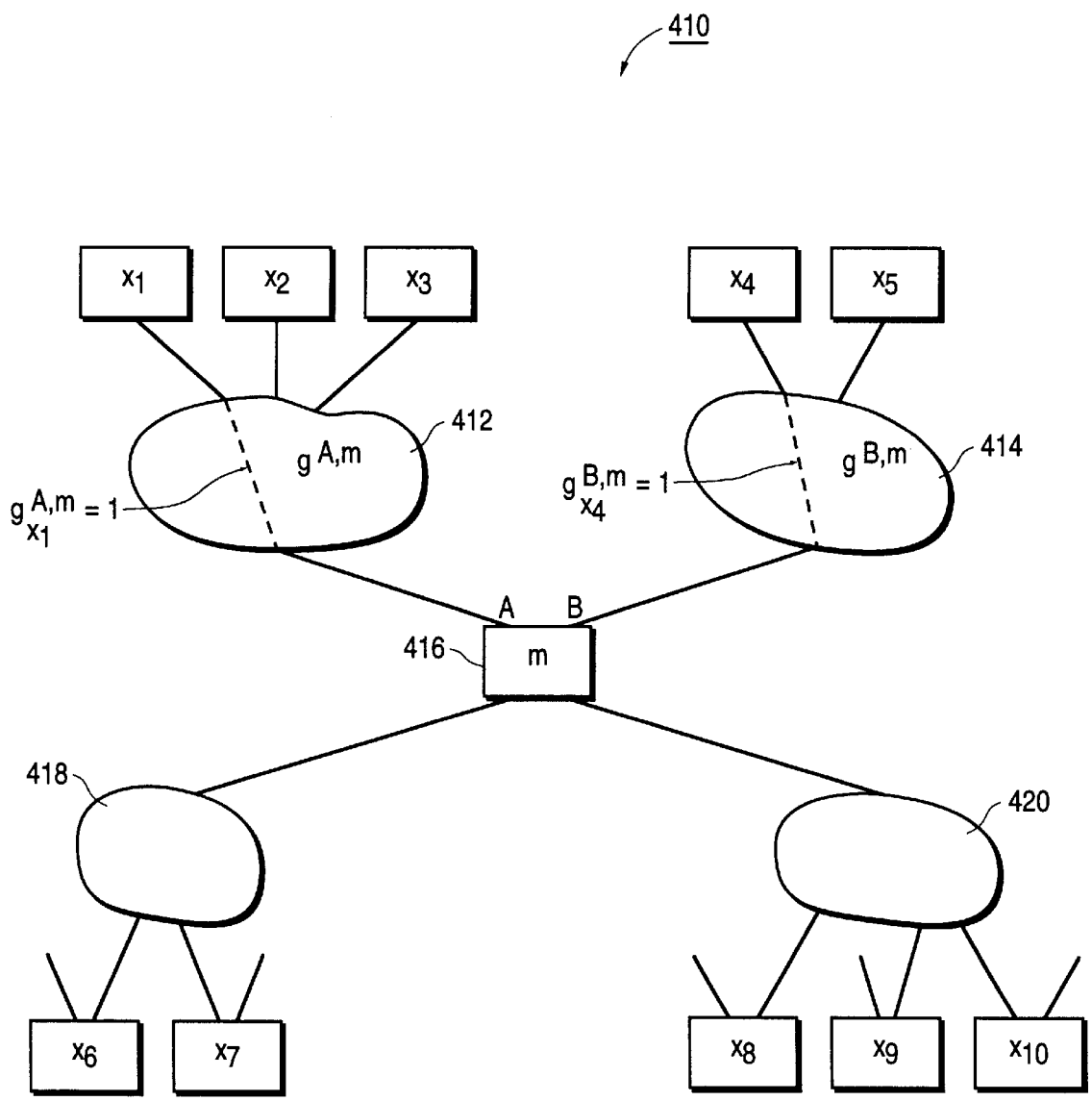
FIG. 7A is a generic block diagram of a circuit environment including a node that is a candidate for operand isolation.

General Model. While FIG. 5 illustrates an exemplary node in accordance with the present invention, FIG. 7A illustrates a more general node (e.g., "isolation candidate"), m, used by the present invention and its relationship within a block. In the following, the terms fan-in and fan-out refer to the set of nodes that feed or receive input from a node either directly or through a multiplexer network. It is assumed that a multiplexer network is transparent. In discussions herein, certain conventions are defined as follows:

$FI_A(m)$ = fan-in of node m's input A $FO(m)$ = fan-out of node m's output $ASx$ = activation signal of node x $g^{A,m}$ = function of MUX select signals to MUX network at input A to node M $g^{A,m}(xi)$ = function of MUX select signals connecting xi to input A of node m $f^m$ = power model of node m = $TRx$, toggle rate at output of node x as measured during simulation if node x is not isolated $TRx^*$ = 0, if x isolated and (ASx = 0)

= $TRx/p(ASx)$, if x isolated and (ASx = 1)

Each of the inputs A and B of node m is fed by multiplexer networks $g^{A,M}$ and $g^{B,M}$, respectively. Multiplexer network $g^{A,M}$ in turn is fed by three nodes x1, x2 and x3. The fan-in of A, is therefore represented by:

$FI_A(m) = \{1, x2, x3\}$

Multiplexer network $g^{B,M}$ in turn is fed by two nodes x4 and x5. The fan-in of B, is therefore represented by:

$FI_B(m) = \{x4, x5\}$

The output of node m feeds two multiplexer networks to connect the output to its sinks and is expressed by:

$FO(m) = \{x6, x7, x8, x9, x10\}$

Depending on the select inputs to the multiplexer networks $g^{A,M}$ and $g^{B,M}$, different nodes from the fan-in of node m are connected to the node's inputs A and B. For each node, xi, in the fan-in of an input A of node m the present invention constructs a Boolean function $g^{A,M}(xi)$ in the select inputs to the corresponding multiplexer network which evaluates to logic "1" if and only if the output of xi connects to A. The same is true for input B with respect to multiplexer network $g^{B,M}$. In one embodiment of the present invention, the activation signal function is only determined for specific nodes having predefined arithmetic units (e.g., adders, ALUs, etc.) located therein. In an alternative embodiment, the activation signal function is reduced in coverage for a given node if the incorporation of the isolation circuitry exceeds prescribed constraints.

Blocking Circuits. Operand signal blocking circuits ("blocking circuits") in accordance with the present invention can be implemented using a variety of circuits and the usage of latches is exemplary only. For instance, transparent (e.g., level sensitive) latches and edge triggered latches can be used. Also, AND gates and OR gates can be used as blocking circuits where one input of the gate is the operand signal line to be selectively blocked and the other input is the activation or isolation signal. Alternatively, pass gates or multiplexers can be used as blocking circuits in accordance with the present invention.

As shown in FIG. 7B, an AND gate 422 is used as a blocking circuit to selectively block operand signal B using a control signal A. The logical equivalent circuit is also shown in FIG. 7B using a multiplexer 424 having a logical '0' input and an operand signal B input that is selectively blocked using the control signal A coupled to the select line of the multiplexer 424. In FIG. 7C, an OR gate 426 is used as a blocking circuit to selectively block operand signal B using a control signal A. The logical equivalent circuit is also shown in FIG. 7C using a multiplexer 428 having a logical '1' input and an operand signal B input that is selectively blocked using the control signal A coupled to the select line of the multiplexer 428. As these examples show, multiplexers can be used as equivalent circuits for AND and OR gates herein.

Figure 8A:
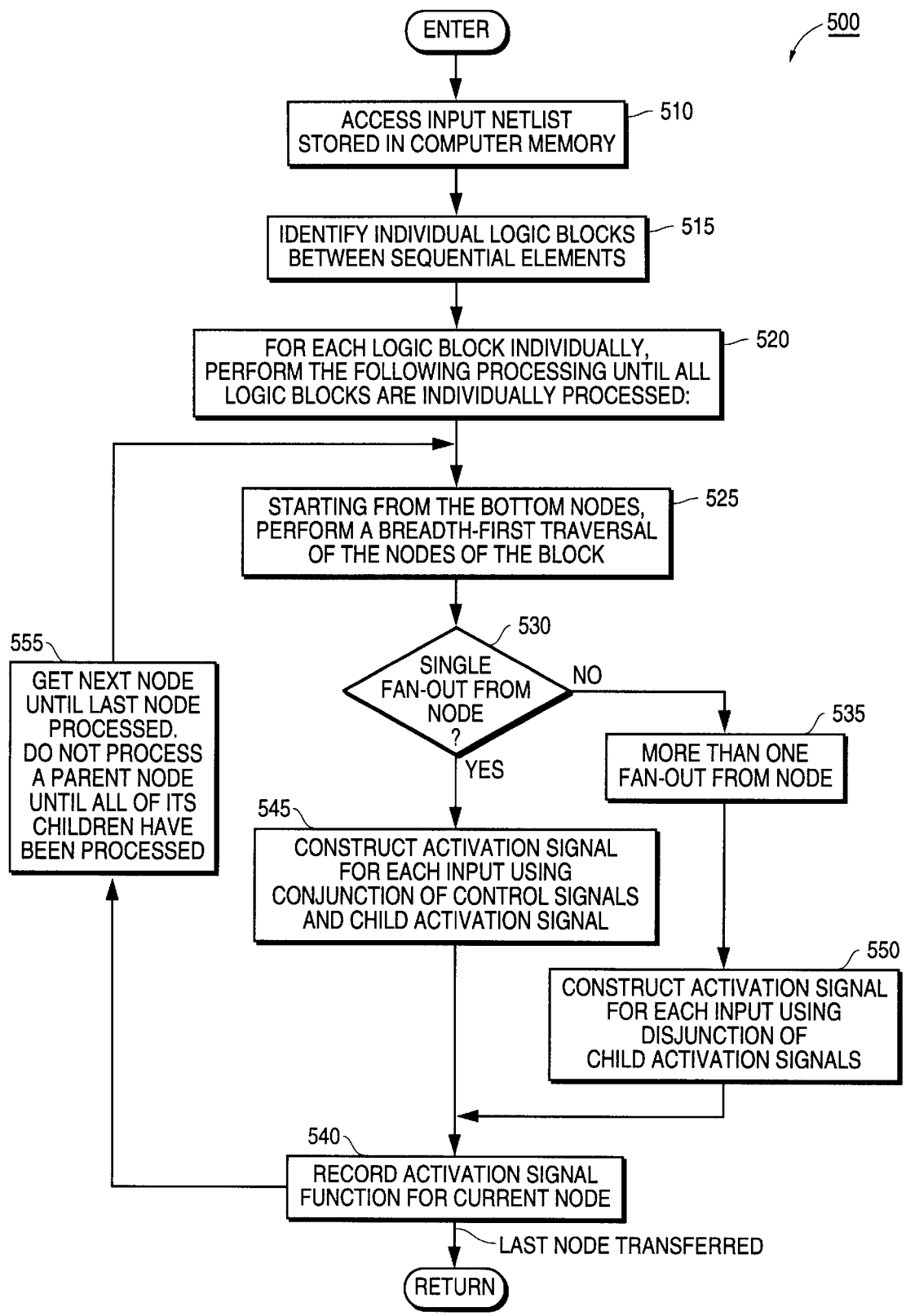
FIG. 8A is a flow chart of steps performed within the present invention for traversing nodes of an input netlist to determine activation signal functions for each node within the input netlist.

Activation Signal Function Determination Process. FIG. 8A illustrates a process 500 for constructing the activation signal function for nodes within input netlist 150a in accordance with the present invention. Process 500 is realized as instruction code stored within computer readable memory units of system 112 (FIG. 2) and executed over processor 101. Process 500 commences at step 510 where the input netlist 150a is accessed by reading computer readable memory units of system 112 which store the netlist 150a data structure. At step 515, well known methods are used to identify the blocks of netlist 150a that define the circuitry that reside between sequential circuits of the netlist 150a. At step 520, the present invention performs the following processes on each identified logic block separately.

At step 525, starting from the termination nodes, e.g., the nodes located at the bottom of the graph data structure, the present invention performs a breadth-first traversal of the nodes of the block of the netlist 150a. In one embodiment, termination nodes are defined as those nodes which are primary outputs of the design or which are inputs to registers (or sequential elements). With reference to FIG. 3A, the primary output nodes are 165,185, 187 and 179 and the register is 216. Therefore, the termination nodes for the netlist portion 150a are 165, 185, 187, 179 and 216. As mentioned above, because the activation signal function of a node depends on the activation signal functions of nodes in its transitive fan-out, active signal functions are constructed in a bottom-up fashion starting at the outputs of a block of combinational logic.

At step 525 of FIG. 8A, a current node from netlist 150a is traversed (e.g., selected) and depending on the number of fan-outs from the current node, the present invention constructs an activation signal function applicable to the inputs of the current node. At step 530, if the current node has a single fan-out (or less), then step 545 is entered. At step 545, the present invention constructs an activation signal function for the inputs of the current node based on a conjunction Boolean expression (e.g., AND) of any control signals of the current node and the activation signal of any child node of the current node. The activation signal function represents the states that are required for the input to pass through the current node and be used by the node's transitive fan-out. The pertinent control signals used in the activation signal function include multiplexer select signals and element enable signals (e.g., register enable signals) and can be extended to include any signal required of a combinational logic block to allow passage of an input through to the node's output.

At step 530, if the currently traversed node had more than one output (e.g., multiple fan-outs), then step 550 is entered. At step 550, the present invention constructs an activation signal function for the inputs of the currently traversed node based on a disjunctive Boolean expression (e.g., OR) involving the activation signal of any child node of the current node and any control signals of the current node. The activation signal function represents the states that are required for the input to pass through the current node and be used by one of the node's transitive fan-outs. Again, the pertinent control signals used in the activation signal function include multiplexer select signals and element enable signals (e.g., register enable signals) and can be extended to include any signal required of a combinational logic block to allow passage of an input through to the node's output.

After either of steps 545 or 550, at step 540 of FIG. 8A, the present invention records the activation signal function that was generated by step 545 or 550 (as the case may be) within a data structure located in computer readable memory units of system 112 and associates this activation signal function with the inputs of the currently traversed node. Then, step 555 is entered where a next node up the netlist graph 150a is obtained. Using a breadth-first traversal, the present invention does not traverse a parent node until all of its children have been traversed. Therefore, at step 555, if a parent node is encountered that has a child node that has not yet been traversed by process 500, step 555 iteratively selects nodes down the child node's branch (bottom to top) until all nodes of this branch are traversed.

For example, refer to FIG. 3A and assume node 216 and node 212 have been traversed and the next node to be traversed is node 156. Assume also that the branch from node 158 to node 165 has not yet been traversed. At step 555, the present invention determines that a child of node 156 (e.g., the child node 158) has not yet been traversed. Therefore, step 555 first selects the lowest node (165) along the child branch between nodes 165 and 158 so that each node in the child branch is iteratively processed bottom to top. In this case, step 555 selects node 165 to be the next node for traversal, not node 156. Therefore, in this example, node 156 is not traversed until both node 212 and node 158 have been processed.

After selecting a new node for traversal, step 525 and step 530 are entered to traverse the currently selected node. This process continues until all nodes within the input netlist 150a have been traversed by process 500. After process 500, the data structure within the computer readable memory units of system 112 have an activation signal function for each input of each node.

In one embodiment of the present invention, activation signal functions can be extended beyond the boundary of a register circuit. In this embodiment, inputs to register circuits are not considered termination points because the activation signal functions consider the usage of the data within a register by downstream circuits, e.g., across multiple clock cycles. Although leading to more complex activation signal functions, more power conservation can be obtained form this technique.

Figure 9A:
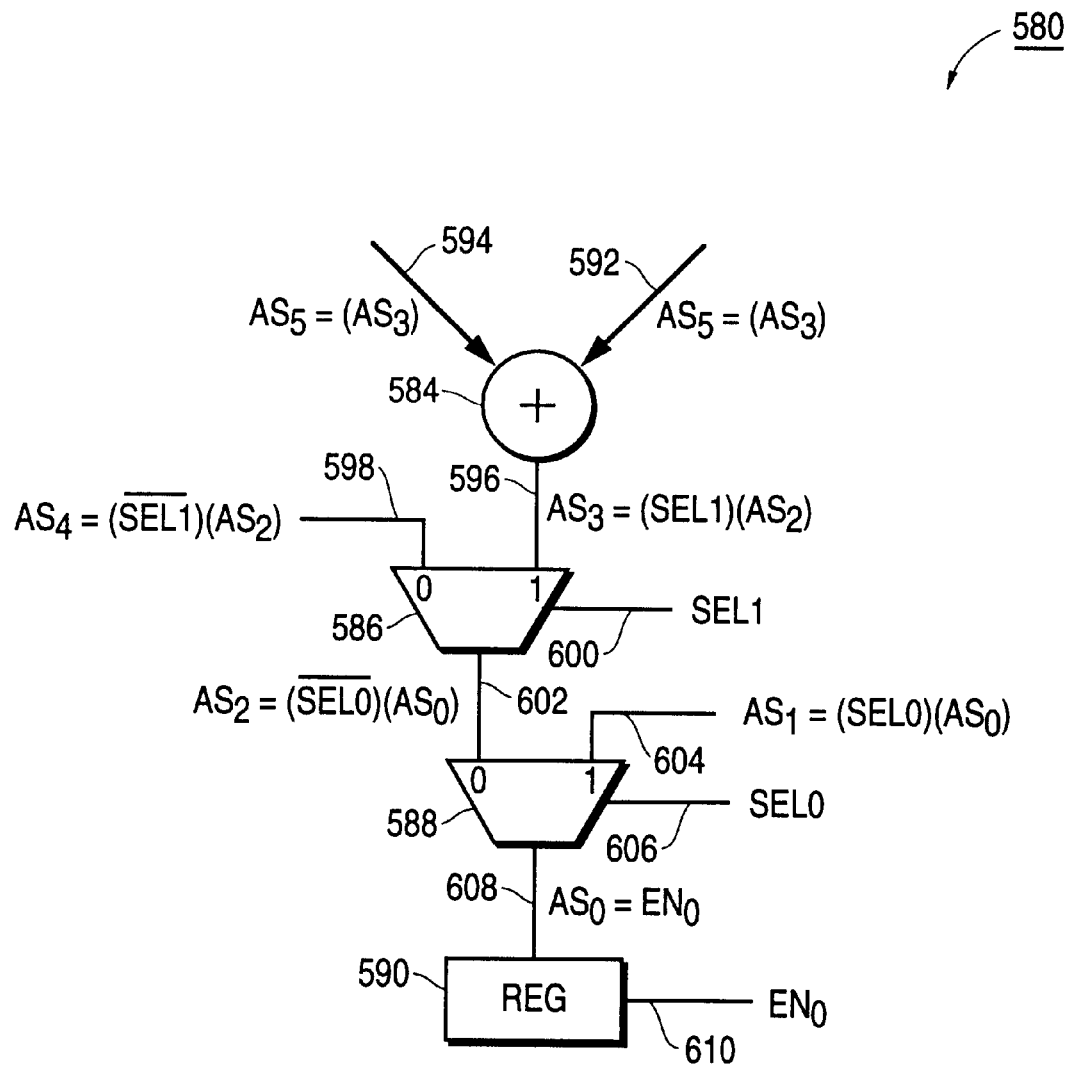
FIG. 9A illustrates an example of the activation signal function determination process of the present invention for a node having a single fan-out.

Step 545 Examples. FIG. 9A illustrates some exemplary activation signal functions generated by iterations of step 545 of FIG. 8A in accordance with the present invention for an exemplary netlist portion 580. Process 500 commences node traversal at register 590 because this is a termination point. At step 545, the activation signal function for the input 608 of node 590 is determined to be AS0=EN0 because the only control signal in register 590 is the enable signal EN0 610 and there are no children of register 590. The next current node traversed is mux 588 which has two inputs. At step 545, the activation signal function for the input 602 of node 588 is determined to be AS2=(#Sel0) AND (AS0) because the pertinent control signal for mux 588 is #Sel0 606, the activation signal function for child node 590 is AS0, and the conjunctive Boolean expression, AND, is used because node 588 has only one fan-out. Similarly, the activation signal function for the input 604 of node 588 is determined to be AS1=(Sel0) AND (AS0).

The next current node traversed is mux 586 of FIG. 9A which has two inputs. At step 545, the activation signal function for the input 598 of node 586 is determined to be AS4=(#Sel1) AND (AS2) because the pertinent control signal for mux 586 is #Sel1 600 and the pertinent activation signal function for child node 588 is AS2. Node 586 has only one fan-out. Similarly, the activation signal function for the input 596 of node 586 is determined to be AS3=(Sel1) AND (AS2). The next current node traversed is adder 584 which has two inputs. At step 545, the activation signal function for both inputs 592 and 594 of node 584 is the same and is determined to be AS5=AS3 because there is no control signal for adder 584 and therefore the control signal, AS3, for the child node 586 is selected. Node 584 has only one fan-out. By expansion of the above expressions, the activation signal function, AS5, for the adder inputs 594 and 592 is therefore:

AS5=(Sel1) AND (#Sel0) AND (EN0)

For each node traversed through step 545 of FIG. 8A, the present invention records the determined activation signal function within computer readable memory units of system 112 and associates each activation signal function with its corresponding node.

Figure 9B:
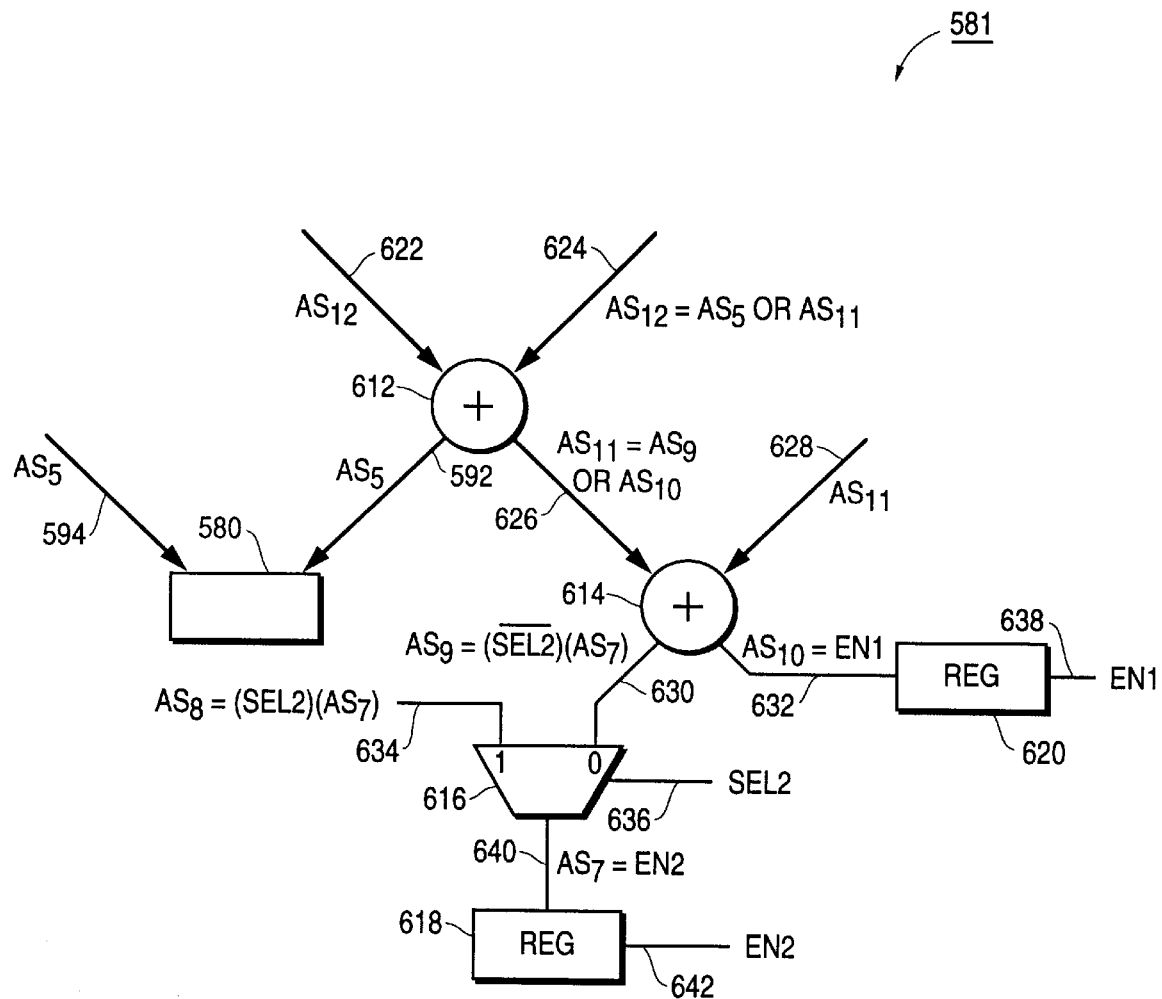
FIG. 9B illustrates an example of the activation signal function determination process of the present invention for a node having multiple fan-outs without a control signal within the node.

Step 550 Examples. FIG. 9B illustrates some exemplary activation signal functions generated by iterations of step 550 of FIG. 8A in accordance with the present invention for an exemplary netlist portion 581 which includes netlist 580. Process 500 commences node traversal at register 618 because this is a termination point. At step 545, the activation signal function for the input 640 of node 618 is determined to be AS7=EN2 because the only control signal in register 618 is the enable signal EN2 642 and there are no children of register 618. The next node traversed is 616 having two inputs 634 and 630. Step 545 is used, as described above, to determine activation signal function AS8=(Sel2)(AS7) for input 634 and to determine activation signal function AS9=(#Sel2)(AS7) for input 630. Node 616 has only one fan-out.

Using a breadth-first traversal, node 614 cannot yet be processed because one of its children, node 620, has not yet been processed. Therefore, the next node processed is 620, which is processed by step 545 and the activation signal function AS10=EN1 is determined for the input 632.

It is appreciated that step 550 of FIG. 8A is then used to determine the activation signal function for node 614 because it has more than one fan-out. The disjunctive Boolean expression (e.g., OR) is used between the activation signals of the children (node 616 and 620) of adder 614. The determined activation signal function for input 626 and input 628 is AS11=(AS9) OR (AS10). By expansion of the above expressions, the activation signal function, AS11, for the adder inputs 594 and 592 is determined by step 550 to be:

AS11=[(#Sel2) AND (EN2)] OR [(EN1)]

The next node to be traversed is then adder 612 which has two fan-outs and is therefore processed by step 550. Assume all nodes of netlist 580 of FIG. 9A have already been processed by the activation signal function determining process 500 of the present invention. At step 550, the disjunctive Boolean expression (e.g., OR) is used between the activation signals of the children (node 584, FIG. 9A, and 614) of adder 612 of FIG. 9B. The determined activation signal function for input 622 and input 624 is AS12=(AS5) OR (AS11). By expansion of the above expressions, the activation signal function, AS12, for the adder inputs 622 and 624 is determined by step 550 to be:

AS12=[(Sel1) AND (#Sel0) AND (EN0)] OR [[(#Sel2) AND (EN2)] OR (EN1)]

Figure 8B:
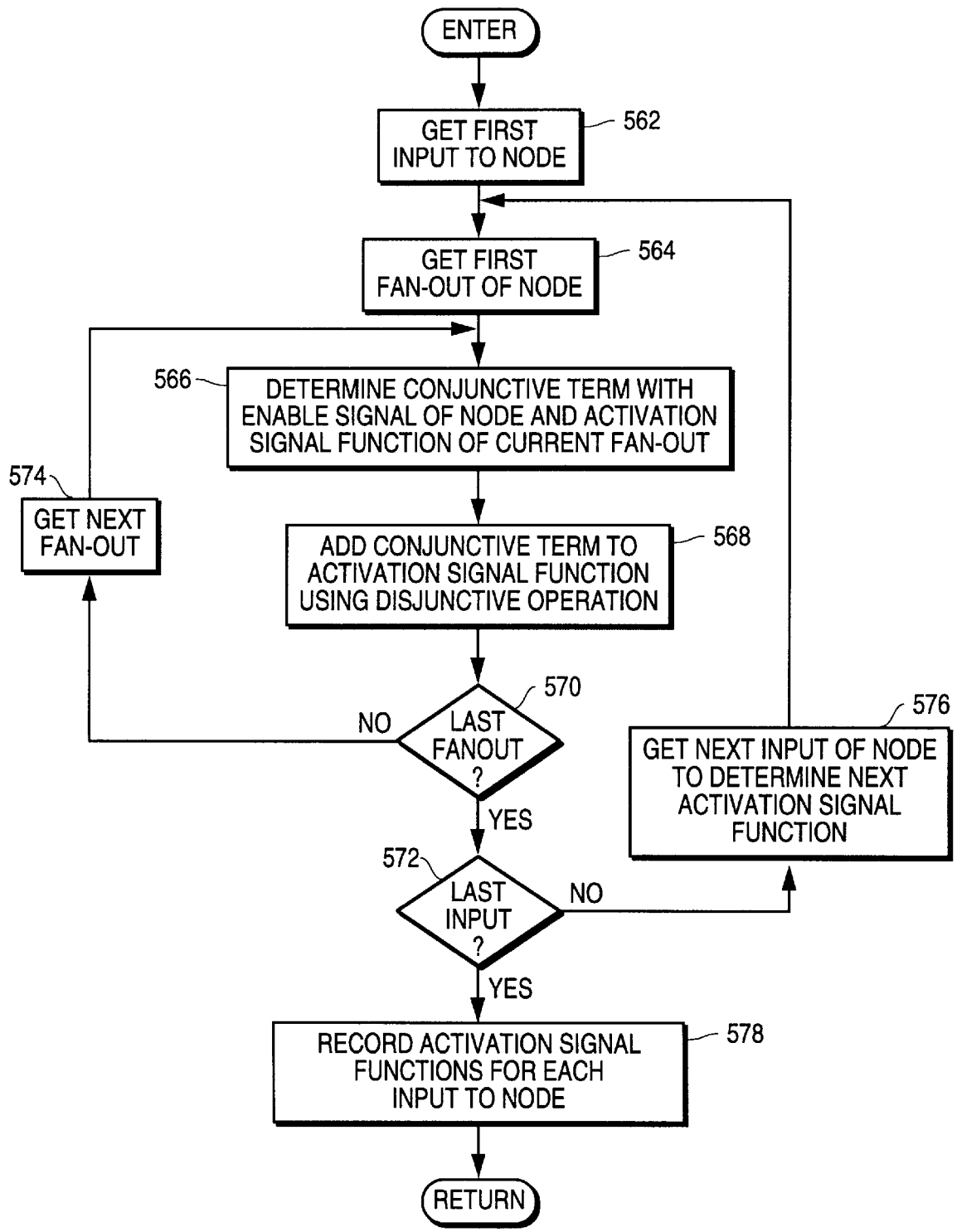
FIG. 8B is a flow chart of steps performed by the present invention for a case in which a node has multiple fan-outs and a control signal.
Figure 9C:
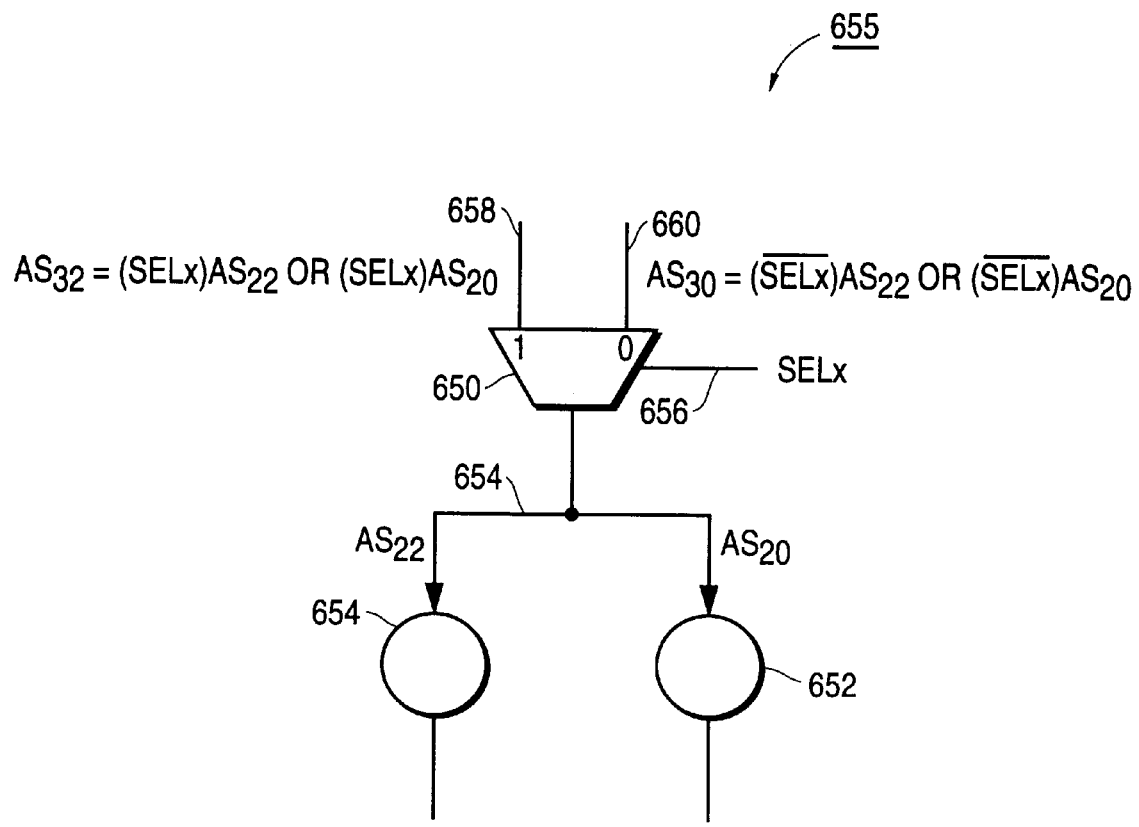
FIG. 9C illustrates an example of the activation signal function determination process of the present invention for a node having multiple fan-outs and also having a control signal within the node.

FIG. 8B and the circuit 655 of FIG. 9C illustrate another exemplary case involving step 550. In this case, the currently traversed node 650 has a control signal applicable in addition to having multiple fan-outs. In this case, step 550 of process 500 is used to construct the activation signal function for node 650. As before, the activation signals, AS22 and AS20, of the inputs of the child nodes are used and a disjunctive Boolean expression is used.

Assume that both AS22 and AS20 are known from previous node traversing of process 500. Further, the control signal, Selx 656, is also used. The resulting activation signal function for input 658 is determined by step 550 to be:

AS32=[(Selx)AS22] OR [(Selx)AS20]

Likewise, the resulting activation signal function for input 660 is determined by step 550 to be:

AS30=[(#Selx)AS22] OR [(#Selx)AS20]

FIG. 8B illustrates one exemplary embodiment of the processing of step 550 in the above described case where the currently traversed node has a control signal applicable in addition to having multiple fan-outs. At step 562, the first input (e.g., input 658) to the currently traversed node (e.g., node 650) is selected for determining its activation signal. At step 564, the first fan-out of the node is selected. At step 566, a conjunctive term is determined including the control signal of the node (e.g., Selx) and the activation signal function of the current fan-out (e.g., AS22). The exemplary conjunctive term is then equal to (Selx)AS22. At step 568, the conjunctive term is added to the activation signal function determined so far using a disjunctive Boolean operator (OR). On the first pass through, the activation signal function for the first input 658 equals (Selx)AS22.

At step 570, a check is made if the last fan-out is processed. In this example, another fan-out exists, so at step 574 the next fan-out is selected and step 566 is entered. At step 566, the conjunctive term (Selx)AS20 is determined and at step 568 this term is added (using OR) so that the activation signal function equals (Selx)AS22 OR (Selx) AS20. This continues until all fan-outs of the currently traversed node are added to the activation signal function for the current input.

Step 572 of FIG. 8B directs process 550 to perform the above processing for each input of the currently traversed node. At step 576, the present invention selects the next input to the currently traversed node and step 564 is entered. At step 578, the activation signal functions for each input to the node are recorded and process 550 returns.

Exemplary Circuit of FIG. 4. Process 500 of the present invention is now applied to the exemplary circuit 200a of FIG. 4 to illustrate the manner in which activation signal function AS0 of FIG. 5 is determined. Refer concurrently to FIG. 3A, FIG. 4, FIG. 5 and FIG. 8A. The activation signal function, AS0, is applicable to both inputs 230 and 232 of adder 210. It is assumed that activation signal function, AS1 (for adder 222), has been determined already by previous processing of the present invention. According to process 500, node traversal through circuit 200a can occur using one of two possible node traversal orders, each is equivalent to the other. In the first traversal order, node 216 is processed, followed by node 212, followed by node 220, then node 214 followed by node 210 lastly. In the second traversal order, node 220 is processed, followed by node 214, followed by node 216, then node 212 followed by node 210 lastly.

With respect to the inputs of adder 210, the activation signal functions of inputs 254, 252, and 256 are not relevant because these inputs do not affect the signal path between the output 240 of adder 210 and any downstream circuit that could eventually use this data. In other words, inputs 254, 252, and 256 are not generated by any children or grandchildren, etc., of adder 210 nor are these inputs 254, 252 and 256 control signals of any children or grandchildren, etc., of node 210. Using the first traversal order, when node 216 is traversed, the activation signal function for input 242 is determined by step 545 to be EN 266. When node 212 is traversed, the activation signal function for input 240b is determined by step 545 to be equal to (#Sel2) AND EN. When node 220 is traversed, step 545 is used to determine the activation signal function for input 234 which is (#Sel1) AND (AS1). When node 214 is traversed, step 545 is used to determine the activation signal function for input 240a which is (Sel0) AND [(#Sel1) AND (AS1)].

Figure 6:
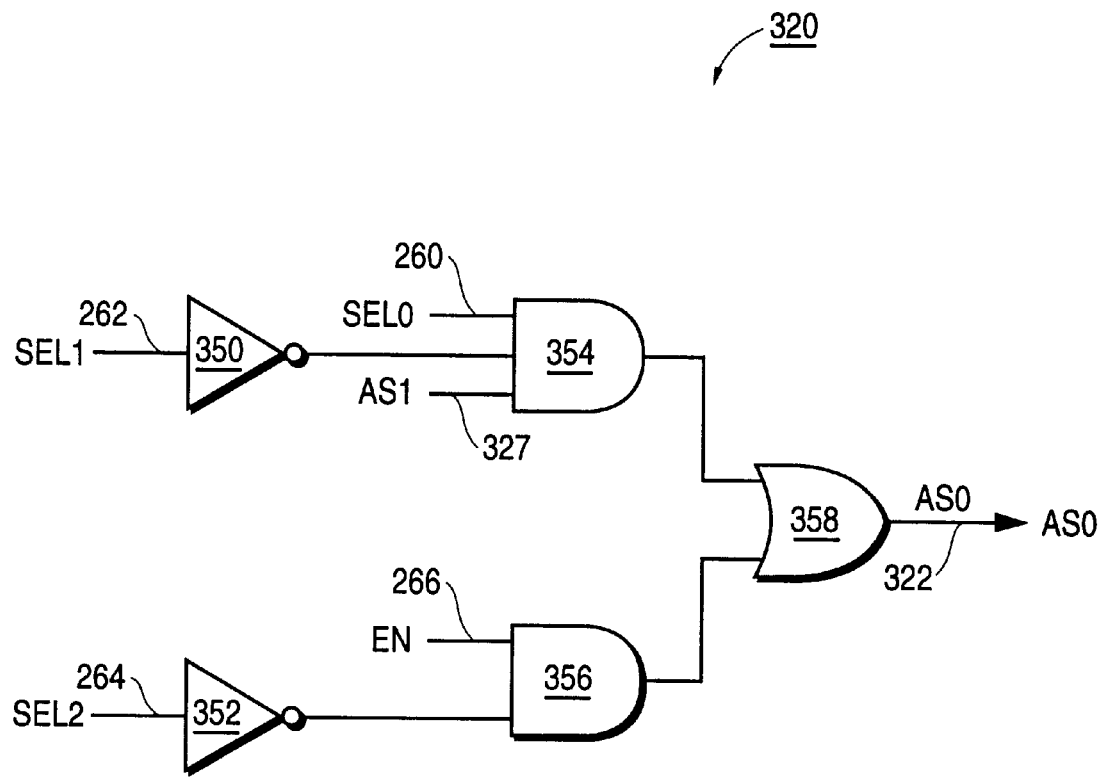
FIG. 6 is a circuit schematic of one embodiment of the activation signal generation circuit for the first subgraph circuit of FIG. 5.

When node 210 is traversed, the activation signal function AS0 is determined by step 550 to be AS0=[(#Sel2) AND EN] OR [(Sel0) AND [(#Sel1) AND (AS1)]]. As shown in FIG. 5, when the activation signal function AS0 is implemented by an activation signal circuit 320, the following inputs are required, Sel0 260, Sel1 262, Sel2 264, EN 266 and AS1 327. FIG. 6 illustrates one implementation of the resultant circuitry within the activation signal generation circuit 320 to generate activation signal AS0 322 used to control latches 312 and 310.

Method and System for Incorporating Activation Signal Generation Circuitry in a Node For a number of different reasons, not every activation signal function determined by process 500 of the present invention is always implemented in circuitry and added to netlist 150a. Generally, the addition of the activation signal generation circuit for a particular node can exceed certain specified timing, area, or power consumption constraints associated with the input netlist 150a. If these constraints are not satisfied, then the present invention does not add the activation signal generation circuitry to the specified node. Also, the addition of the activation signal generation circuitry, in certain cases, can consume more power in the determination of the activation signal than is saved by using operand isolation. In these instances, the present invention does not add the activation signal generation circuitry the specified node.

Figure 10:
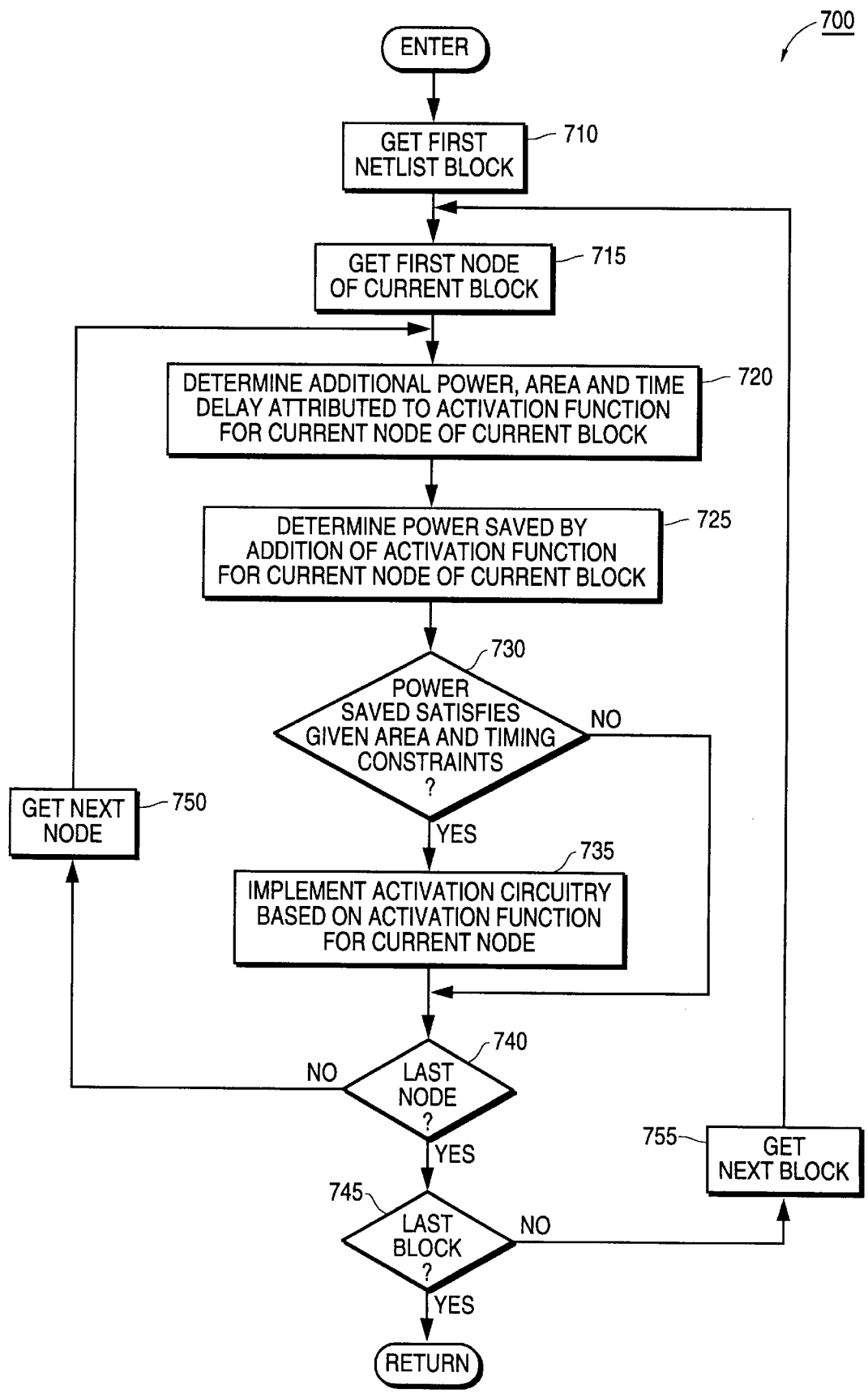
FIG. 10 illustrates steps within the present invention for traversing each node and deciding whether or not to implement operand isolation circuitry within each node based on power, area and timing considerations.

FIG. 10 illustrates a process 700 performed by the present invention on each node to determine whether or not the activation signal function should be implemented in by activation signal generation circuitry. Process 700 is realized as instruction code stored within computer readable memory units of system 112 (FIG. 2) and executed over processor 101. Process 700 commences at step 710 where the first block of the input netlist 150a is accessed and at step 715 the first node of the first block is accessed as the current node and the activation signal function for the current node is accessed from memory.

At step 720, the present invention uses well known circuit synthesis techniques to synthesize the circuitry required to construct the activation signal function of the current node, the associated blocking circuitry and any required connections for these circuits. Step 720 then uses computer implemented power estimation to determine the additional power consumed by operation of the activation signal generation circuitry, the associated blocking circuits and the connections for the current node. A number of different power estimation techniques can be used at step 720. Step 720 then uses well known computer implemented area determination techniques to determine the additional area consumed by adding the activation signal generation circuitry, the associated blocking circuits and connections for the current node. A number of area estimation techniques can be used at step 720. Third, step 720 then uses well known computer implemented delay estimation techniques to determine the additional delay time attributed to the propagation of the output of the current node by adding the activation signal generation circuitry (and the associated blocking circuits) of the current node. A number of propagation delay estimation techniques and well known timing models can be used at step 720.

At step 725 of FIG. 10, the present invention estimates, for the current node, the amount of power that is saved by performing operand isolation, ignoring the power consumed by the activation signal generation circuitry (and the associated blocking circuits) of the current node. Input toggle rates to the current node are used in this determination as well as the percentage of clock cycles that the output of the current node is actually used by the integrated circuit device. As described further below, primary, secondary and static power savings can be determined at step 725 in accordance with one embodiment of the present invention.

At step 730, the present invention then determines a power ratio of the amount of estimated power consumed by the activation signal generation circuitry (as determined by step 720) over the amount of estimated power saved by operand isolation, as determined in step 725, using the activation signal generation circuitry. In one embodiment, if the power ratio is outside a certain threshold, then step 735 is skipped and the activation signal generation circuitry (including blocking circuits) is not added to the current node and operand isolation is not used for this node.

Also at step 730 of FIG. 10, the present invention checks if the power savings is worth the added area and timing costs. Step 730 checks if predetermined area constraints associated with the input netlist 150a are satisfied taking into consideration the possible addition of the activation signal generation circuitry (and any blocking circuits) for the given node. If area constraints are not satisfied, or, if certain area and power savings ratios are not satisfied, then step 735 is skipped and the activation signal generation circuitry (including blocking circuits) is not added to the current node and operand isolation is not used for this node. At step 730, the present invention also checks if predetermined timing constraints associated with the input netlist 150a are satisfied taking into consideration the possible addition of the activation signal generation circuitry (and any blocking circuits) for the given node. If timing constraints are not satisfied, or, if certain timing and power savings ratios are not satisfied, then step 735 is skipped and the activation signal generation circuitry (including blocking circuits) is not added to the current node and operand isolation is not used for this node. Within one embodiment, for area and timing checks, relative power/area gains and relative power/delay gains are considered at step 730. These ratios are discussed more fully below.

At step 735, the present invention modifies the input netlist 150a to add the synthesized activation signal generation circuitry and related blocking circuits to the node input signal lines to implement operand isolation for the current node. Also at step 735, the present invention properly couples the activation signal generation circuitry to receive the proper control signals (and/or other activation signals) and to control the blocking circuits. This is performed only after performing the above mentioned power, area and timing checks.

For instance, with reference to exemplary circuit 200a of FIG. 4, the present invention at step 735 adds activation signal generation circuit 320 (FIG. 5) and also blocking circuits 312 and 310 and couples input signals 260, 262, 264, 266 and 327 and couples output activation signal 322 appropriately to implement operand isolation for this node. The result is a netlist 150b containing circuit 200b (FIG. 5).

At step 740 of FIG. 10, a check is made if the last node has been processed for the current block. If not, then another node of the current block is accessed at step 750 and step 720 is re-entered. If the last node has been processed, then at step 745 a check is made if the last block has been processed. If not, at step 755, the next block is obtained and step 715 is re-entered. If the last block has been processed, then process 700 returns and netlist 150b is constructed and output by system 112.

Estimating Power Savings for a Node

The following section describes certain relationships that can be used in the present invention in performing steps 720–730 of FIG. 10. Isolating a node has a two-fold effect on the power consumption of the node. Apart from blocking switching activity at the node's inputs, operand isolation also decreases switching activity at the node's output, thereby reducing power consumption in the fan-out nodes. To determine the potential savings in power consumption induced by isolating a node in accordance with the present invention, each isolation candidate is characterized by primary power and also secondary power. Primary power is power savings in the node itself and secondary power is power savings in the fan-out nodes.

Estimating Primary Power Savings. Without operand isolation, the power consumption Px of a node, x, only depends on the activity on its inputs according to the following relationship:

$$Px = f^x(TR_A, TR_B)$$

where $TR_A$ and $TR_B$ are the toggle rates at inputs A and B, respectively with reference to FIG. 7A. The toggle rates can be re-computed by simulation after each iteration of the present invention. To compute the amount of power, $\Delta P^x p$, saved by isolating the node's input, we have to consider the amount of time the node is actually inactive:

$$\Delta P^x p \text{ (primary)} = p(\#ASx) \cdot f^x(TR_A, TR_B)$$

In turn, the toggle rates at the node inputs depend on whether the nodes feeding the inputs are themselves isolated or not. Assume that nodes xi and xj are connected to inputs A and B, respectively, with a configuration as shown in FIG. 11A. Then, $\Delta P^x p$ is more accurately expressed in the relationship of FIG. 11B taking into account the different configurations of the activation signals of those nodes feeding the inputs of the node under consideration. With respect to FIG. 11B, the symbol "—|" is negation and the symbol "∧" is the AND function.

Summing over all possible configurations of the input multiplexer networks (824 of FIG. 12A), for isolating both inputs, yields the final estimate of power savings which is shown in the relationships of FIG. 12B. The relationships of FIG. 11B and FIG. 12B are used in one embodiment of the present invention at step 725 to determine the power savings of the node.

Estimating Secondary Power Savings. The impact of isolating a node x on a fan-out node xi is now discussed. It is appreciated that node x connects to input A of node xi, and that input B is connected to a third node xj. By isolating node x, the toggle rate at input A of node xi is reduced to zero when node x is inactive, therefore:

$$\Delta P^x s \text{ (secondary)} = p(\#ASx) \cdot [f^{xi}(TR_x, TR_{xj}) - f^{xi}(0, TR_{xj})]$$

where $\Delta P^x s$ denotes the secondary power savings at node x.

However, node xi in turn can have been isolated in a previous iteration, so that the toggle rates at its inputs are also zero when inactive. The isolation of a node xi is modeled by assigning a binary decision variable xi(bar) to it whose value is '1' only if node xi has been isolated, otherwise xi(bar)=0. For ASxi=0, the power savings in node xi is not considered if xi(bar)=1 and therefore the secondary power savings, $\Delta P^x s$, is shown by the relationship of FIG. 13A. The same reasoning applies to the output of node xj which is connected to input B of node xi. Its toggle rate can also have been affected by operand isolation in a preceding step and therefore the resulting secondary power savings, $\Delta P^x s$, is shown by the relationship of FIG. 13B.

So far, a single fan-out node xi has been considered which receives data from nodes x and xj on its inputs A and B, respectively. The present invention provides an analysis that is broadened to include all nodes feeding node xi other than node x, regardless of the input to which they or node x are connected. The resulting secondary power savings $\Delta P^x s$ under this extended analysis is shown by the relationships of FIG. 14.

For the total secondary power savings, $\Delta P^x s$, this embodiment of the present invention performs summation over all nodes in the fan-out of node xi. The resulting $\Delta P^x s$ is shown in FIG. 15. The relationships of FIG. 13A, FIG. 13B, FIG. 14 and FIG. 15 are used in one embodiment of the present invention at step 725 in determining the power savings of the current node.

Static Power Estimation. The model proposed above assumes that the power savings obtained by operand isolation corresponds to the primary and secondary estimates, $\Delta P^x p$ and $\Delta P^x s$, neglecting static power consumption. In accordance with the present invention, the share of static power for isolated components can be modeled as follows:

$$P^{ST,x} = P(\#ASx) \cdot F^x(0, 0)$$

For more accurate estimates, the terms $f^x$ ($TR_{xi}*(ASxi)$, $TR_{xj}*(ASxj)$) are replaced by the expression:

$$f^x\ (TR_{xi}*(ASxi),\ TR_{xj}*(ASxj))-f^x(0, 0)$$

It is appreciated that other methods of computing primary and secondary power consumption may also be employed within the scope of the present invention and the above methods are exemplary only.

Asymmetric Operand Isolation. The above model assumes the operand isolation of both inputs of the node. By reducing the power savings by the remaining power consumption when only one input has zero toggle rate, the model can be modified to consider single input isolation, e.g., on input A, as shown in FIG. 16A. The resulting primary power savings, $\Delta P^x p,A$ is determined according to the relationship shown in FIG. 16B. Isolating input B is modeled analogously in accordance with the present invention. The static and asymmetric power savings are used to estimate the power saved in step 725 of one embodiment of the present invention.

Trading off Area and Timing vs. Power for a Node

In step 730 of FIG. 10, the present invention uses various information to determine if operand isolation circuitry should be implemented for a particular node, or not, depending on power, area and timing considerations. Although a number of different area and timing constraint checks can be employed within the present invention, the following describes one particular process that can be used for area and timing checking with respect to process 700.

Area. With respect to area, power reduction through operand isolation comes at an area increase due to the insertion of isolation circuitry (latches) and also the activation signal generation circuits. A relative figure of merit is introduced which takes into account the area increase incurred by isolating a node. Therefore, within one embodiment of the present invention, operand isolation circuitry is added to a node by process 700 if a minimum threshold, Ta, of power reduction in percent per area increase is exceeded. In this analysis, the following terms are used:

Aest=estimated total area of the design
Pest=estimated total power of the design
B(x)=number of bits to isolate at input of node x
Cb=basic area cost per isolated bit
A(ASX)=area required for activation signal generation circuitry of node x
Ta=minimum ratio of relative power reduction/relative area increase required for isolation The relative increase in area, $A_\wedge$ is formulated as follows:

$$A^\wedge = [(B(x) \cdot Cb) + A(ASx)] / Aest$$

In turn, the relative change in power, Px, by isolating node x is expressed as follows:

$$Px = (\Delta P^x p + \Delta P^x s)/Pest$$

In view of the above, operand isolation circuitry is applied to node x by one embodiment of the present invention if and only if (Px/A$_\wedge$ is equal to or greater than Ta. Therefore, the quotient, (Px/A$_\wedge$ is referred to as the relative power/area gain.

Timing. Similar to area, operand isolation also incurs a timing penalty by delaying signals on the paths on which operand isolation circuitry is added. Within an embodiment of the present invention, isolation circuitry is only added by process 700 if a minimum threshold, Td, of power reduction in percent per slack increase is exceeded. In this analysis, following terms are used:

slack(x)=slack of node x
delay(x)=additional delay introduced by isolating node x
Td=minimum ration of relative power reduction/relative slack increase required for isolation The relative increase in slack, slack$_\wedge$ (x) on node x is expressed as follows:

$$slack^\wedge(x) = delay(x) / slack(x)$$

Operand isolation circuitry is added to node x by one embodiment of process 700 if (Px/slack$_\wedge$ (x)) is equal to or greater than Td. The quotient (Px/slack$_\wedge$ (x)) being referred to as relative power/delay gain.

Reduction of Optimum Activation Signal Function

Figure 17A:
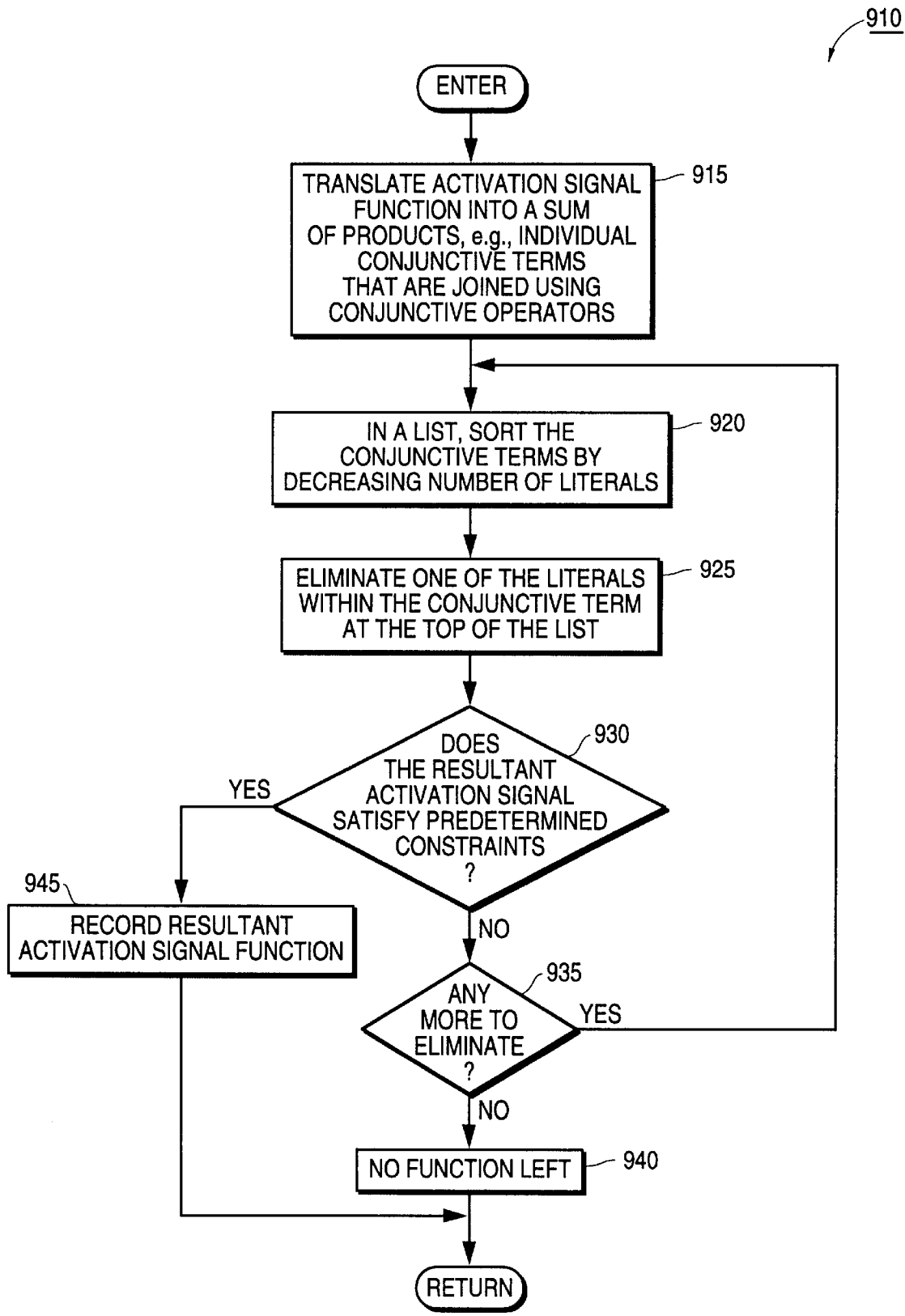
FIG. 17A illustrates steps within a flow diagram of a process in accordance with the present invention for reducing the coverage of an activation signal function for a node in order to meet prescribed constraints.
Figure 17B:
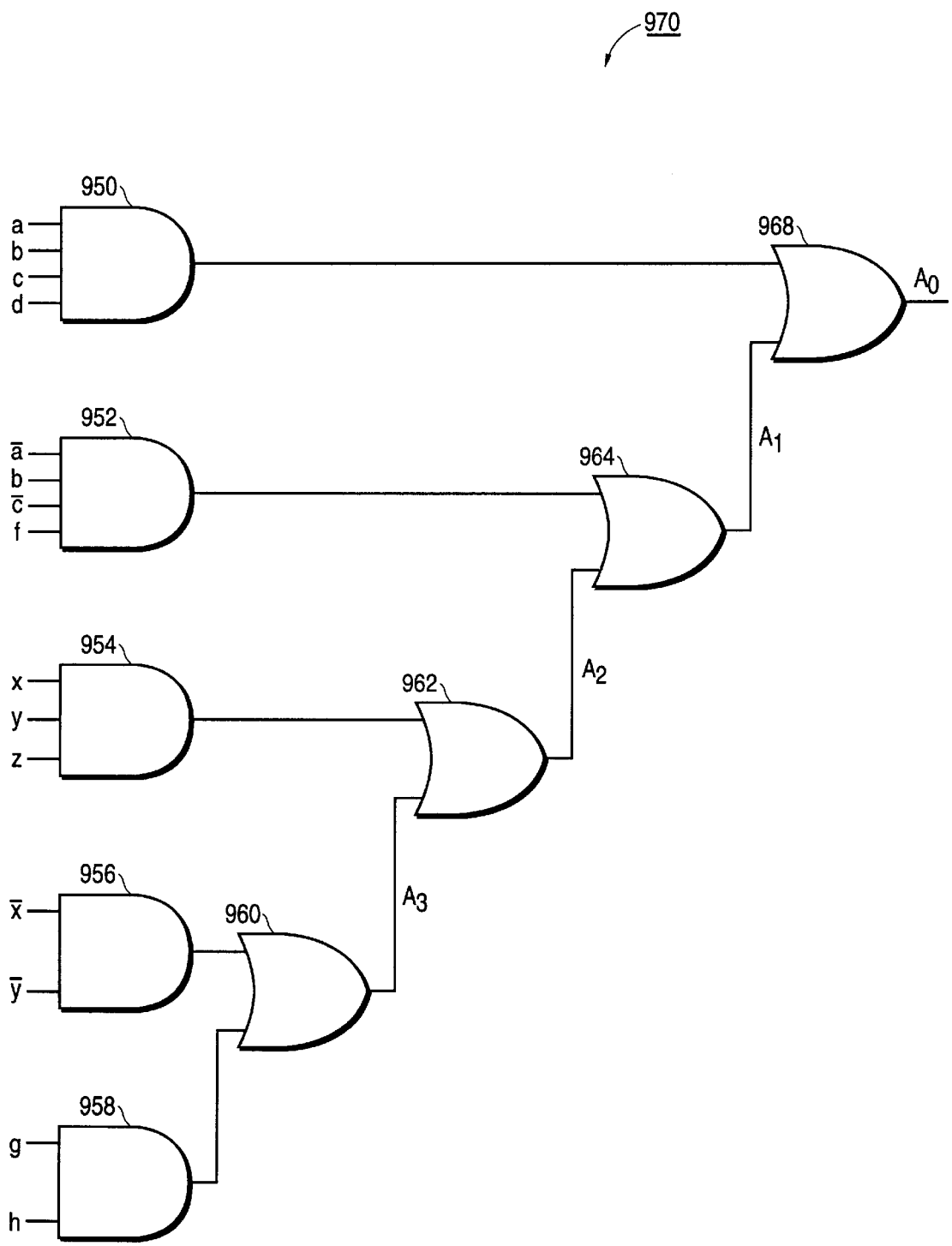
FIG. 17B is an exemplary circuit relating to the process of FIG. 17A.

The optimum activation signal function for a given node, as can be determined above, can also be reduced in coverage in order to satisfy given power, area and/or timing constraints. FIG. 17A and FIG. 17B illustrate an embodiment of the present invention for reducing an optimum activation signal function (that does not meet prescribed constraints) to some subset of all isolation cases.

With reference to FIG. 7B, assume an activation signal function generates activation signal Ao according to:

$$Ao = abcd\ OR\ \#ab\#cf\ OR\ xyz\ OR\ \#x\#y\ OR\ gh$$

The inputs to the AND gates (950–958) are referred to as "literals" and include an input and its negation. Therefore, input a and input #a comprise two literals. Assuming the incorporation of an activation signal generation circuit (with associated blocking circuits) causes the node to exceed certain constraints, this embodiment of the present invention reduces the coverage of the activation signal function until the constraints are satisfied or until it is determined that no operand isolation can be applied for the node.

FIG. 17A illustrates a flow diagram of steps performed by the present invention process 910 for reducing the coverage of an optimum activation signal function previously determined by step 500. Process 910 is implemented as program instructions stored within a computer memory and executed over processor 101 of system 112. It is appreciated that process 910 is applied to a particular node because a determination has been made that its activation signal function does not satisfy certain constraints. At step 915 the activation signal function for a particular node is translated to a sum of products, e.g., conjunctive terms that are joined using disjunctive operators (OR). For instance, Ao=abcd OR #ab#cf OR xyz OR #x#y OR gh.

At step 920, in a list, the conjunctive terms are sorted by decreasing order of literals involved in each conjunctive term. One exemplary result is shown in FIG. 17B where gate 950 is first in the list with four literals, gate 952 is second with four literals, gate 954 is third with three literals, gate 956 is fourth with two literals and gate 958 is last with two literals.

At step 925, one of the literals of the conjunctive term at the top of the list is eliminated (as long as there are two or more literals in the term) resulting in a modified activation signal function having reduced coverage. For instance, the literal, "a" is eliminated from gate 950. The resulting activation signal function would then be: Ao=bcd OR #ab#cf OR xyz OR #x#y OR gh.

At step 930 of FIG. 17A, a determination is made if the resulting activation signal function meets the predetermined constraints (e.g., power, area, timing, etc.). If it does, then at step 945 the resultant activation signal function is recorded and process 910 returns. If at step 930 constraints are still not met, then at step 935 a check is made if there are more literals that can be eliminated from the resultant activation signal function. If so, then step 920 is re-entered, the conjunctive terms are sorted again and another literal is reduced. If at step 935 no more literal remain, then at step 940 it is determined that there is not an activation signal function for this node that will support operand isolation. Process 910 returns.

CONCLUSION

The preferred embodiment of the present invention, a process and system for determining an activation signal function and for selectively implementing determined operand isolation circuitry into a node for power savings, is thus described. While the present invention has been described in particular embodiments, it should be appreciated that the present invention should not be construed as limited by such embodiments, but rather construed according to the below claims.

What is claimed is:

1. A computer implemented method for incorporating operand isolation in an integrated circuit design, said method comprising the steps of:
    a) accessing a netlist describing said integrated circuit design, said netlist having nodes and connections between said nodes;
    b) traversing nodes of said netlist to construct an activation signal function for a node of said netlist, said activation signal function indicating all states in which an output signal generated by said node is used by said integrated circuit design and all states in which said output signal is not used;
    c) synthesizing an activation signal generation circuit based on said activation signal function of said node; and
    d) within said netlist, adding a blocking circuit in the path of an input to said node and adding said activation signal generation circuit to said node to control said blocking circuit.

2. A method as described in claim 1 wherein said blocking circuit is a transparent latch circuit.

3. A method as described in claim 1 wherein step b) comprises the steps of:
    b1) identifying a set of termination nodes within said netlist;
    b2) traversing nodes of said netlist commencing from said set of termination nodes and using a breadth-first traversal process;
    b3) if a node traversed by step b2) has more than one fan-out then constructing said activation signal function for said node using a first Boolean operator, control signals associated with said node, and activation signals of child nodes of said node; and
    b4) if a node traversed by step b2) has less than two fan-outs then constructing said activation signal function for said node using a second Boolean operator, control signals associated with said node, and an activation signal of the child node of said node.

4. A method as described in claim 3 wherein said first Boolean operator is the OR function and wherein said second Boolean operator is the AND function.

5. A method as described in claim 3 wherein said activation signal function constructed by steps b3) and b4) is constructed only for a node containing an arithmetic logic element of the set including an adder circuit, an arithmetic logic unit (ALU), and a multiplier circuit.

6. A method as described in claim 3 wherein said control functions of step b3) and step b4) include select lines of nodes that are multiplexers and enable lines of nodes that are registers.

7. A method as described in claim 3 wherein said step b1) comprises the steps of:
    identifying inputs to registers of said netlist; and
    identifying primary outputs of said netlist, wherein said inputs to said registers and said primary outputs are said set of termination nodes.

8. A computer implemented method for incorporating operand isolation in an integrated circuit design, said method comprising the steps of:
    a) identifying a set of termination nodes within a netlist describing said integrated circuit design, said netlist having nodes and connections between said nodes;
    b) constructing activation signal functions for respective nodes, said step b) comprising the steps of:
        b1) traversing nodes of said netlist commencing from said set of termination nodes;
        b2) if a node traversed by step b1) has more than one fan-out then constructing said activation signal function for said node using a first Boolean operator, control signals associated with said node, and activation signals of child nodes of said node; and
        b3) if a node traversed by step b1) has less than two fan-outs then constructing said activation signal function for said node using a second Boolean operator, control signals associated with said node, and an activation signal of the child node of said node; and
    c) producing a modified netlist by adding operand isolation circuitry to node inputs based on said activation signal functions of said respective nodes.

9. A method as described in claim 8 wherein said step b1) is performed using a breadth-first traversal process.

10. A method as described in claim 8 wherein said first Boolean operator is the OR function and wherein said second Boolean operator is the AND function.

11. A method as described in claim 8 wherein activation signal functions are constructed by steps b2) and b3) only for nodes containing an arithmetic logic element of the set including an adder circuit, an arithmetic logic unit (ALU), and a multiplier circuit.

12. A method as described in claim 8 wherein said control functions of step b2) and step b3) include select lines of nodes that are multiplexers and enable lines of nodes that are registers.

13. A method as described in claim 8 wherein said step a) comprises the steps of:
    a1) identifying inputs to registers of said netlist; and
    a2) identifying primary outputs of said netlist, wherein said inputs to said registers and said primary outputs are said set of termination nodes.

14. A method as described in claim 8 wherein said step c) comprises the steps of:

c1) for a first node, adding a blocking circuit in the path of an input to said first node;

c2) synthesizing an activation signal generation circuit based on an activation signal function corresponding to said first node; and c3) adding said activation signal generation circuit to said first node including coupling an output of said activation signal generation circuit to control said blocking circuit added by step c1).

15. A computer implemented method for incorporating operand isolation in an integrated circuit design, said method comprising the steps of:

a) traversing nodes of a netlist describing said integrated circuit design to construct activation signal functions for a plurality of nodes of said netlist, each activation signal function indicating all states in which an output signal generated by an associated node is used by said integrated circuit design and all states in which said output signal is not used;

b) estimating an amount of power saved by incorporating operand isolation circuitry for each node;

c) estimating an amount of additional power consumed by incorporating operand isolation circuitry for each node; and d) adding isolation circuitry to a respective node of said netlist only if a net increase in power savings results, said step d) comprising the steps of:

d1) synthesizing an activation signal generation circuit based on an activation signal function of said respective node; and d2) within said netlist, adding a blocking circuit in the path an input to said respective node and adding said activation signal generation circuit to said respective node to control said blocking circuit.

16. A method as described in claim 15 wherein step a) comprises the steps of:

a1) identifying a set of termination nodes within said netlist;

a2) traversing nodes of said netlist using a breadth-first traversal and commencing from nodes of said set of termination nodes;

a3) if a node traversed by step a2) has more than one fan-out then constructing said activation signal function for said node using a first Boolean operator, control signals associated with said node, and activation signals of the child nodes of said node; and a4) if a node traversed by step a2) has less than two fan-outs then constructing said activation signal function for said node using a second Boolean operator, control signals associated with said node, and an activation signal of the child node of said node.

17. A method as described in claim 16 wherein said first Boolean operator is the OR function and wherein said second Boolean operator is the AND function.

18. A method as described in claim 16 wherein activation signal functions are constructed by steps a3) and a4) only for nodes containing arithmetic logic element of the set including an adder circuit, an arithmetic logic unit (ALU), and a multiplier circuit.

19. A method as described in claim 16 wherein said control functions of step a3) and step a4) include select lines of nodes which are multiplexers and enable lines of nodes which are registers.

20. A method as described in claim 16 wherein said step a1) comprises the steps of:

identifying inputs to registers; and identifying primary outputs of said netlist, wherein said inputs to said registers and said primary outputs are said set of termination nodes.

21. A computer implemented method for incorporating operand isolation in an integrated circuit design, said method comprising the steps of:

a) amended a netlist describing said integrated circuit design, said netlist having nodes and connections between said nodes;

b) traversing nodes of said netlist to determine an activation signal function for a node of said netlist, said activation signal function indicating all states in which an output signal generated by said node is used by said integrated circuit design and all states in which said output signal is not used;

c) provided said activation signal function for said node does not satisfy prescribed constraints, modifying said activation signal function to reduce isolation coverage of said activation signal function until said constraints are satisfied;

d) synthesizing an activation signal generation circuit based on said modified activation signal function of step c); and e) within said netlist, adding a blocking circuit in the path of an input to said node and adding said activation signal generation circuit to said node to control said blocking circuit.

22. The method as described in claim 21 wherein step c) comprises the steps of:

c1) translating said activation signal function into conjunctive terms joined by disjunctive operators;

c2) in a list, sorting said conjunctive terms by descending order of literals;

c3) eliminating a literal from the top conjunctive term of said list to produce said modified activation signal function; and c4) if said modified activation signal function does not meet said prescribed constraints, performing steps c2)–c4) again.

23. A method as described in claim 22 wherein step b) comprises the steps of:

b1) identifying a set of termination nodes within said netlist;

b2) traversing nodes of said netlist commencing from nodes of said set of termination nodes and using a breadth-first traversal process;

b3) if a node traversed by step b2) has more than one fan-out then constructing said activation signal function for said node using a first Boolean operator, control signals associated with said node, and activation signals of child nodes of said node; and b4) if a node traversed by step b2) has less than two fan-outs then constructing said activation signal function for said node using a second Boolean operator, control signals associated with said node, and an activation signal of the child node of said node.

* * * * *